United States Patent
Mc Cabe et al.

(10) Patent No.: US 7,162,405 B2
(45) Date of Patent: Jan. 9, 2007

(54) METHOD FOR MODELING AND VIEWING REAL WORLD OBJECTS IN A NETWORK MODEL AT REAL WORLD TIMES

(75) Inventors: Alejandro Javier Spiritoso Mc Cabe, Buenos Aires (AR); Sebastián César Maruffo, Capital Federal (AR)

(73) Assignee: CertaLogic, Inc., Acton, MA (US)

( * ) Notice: Subject to any disclaimer, the term of this patent is extended or adjusted under 35 U.S.C. 154(b) by 644 days.

(21) Appl. No.: 10/452,528

(22) Filed: Jun. 2, 2003

(65) Prior Publication Data
US 2004/0054508 A1 Mar. 18, 2004

Related U.S. Application Data

(60) Provisional application No. 60/385,168, filed on May 31, 2002.

(51) Int. Cl.
G06F 17/50 (2006.01)
(52) U.S. Cl. .......................................... 703/17; 700/31
(58) Field of Classification Search ................... 703/1, 703/6, 17; 345/420; 700/31
See application file for complete search history.

(56) References Cited

U.S. PATENT DOCUMENTS

| | | | | |
|---|---|---|---|---|
| 6,330,598 | B1* | 12/2001 | Beckwith et al. | 709/223 |
| 6,477,434 | B1* | 11/2002 | Wewalaarachchi et al. | 700/83 |
| 6,487,559 | B1* | 11/2002 | McGrath et al. | 707/200 |
| 6,789,054 | B1* | 9/2004 | Makhlouf | 703/6 |
| 6,839,070 | B1* | 1/2005 | Meandzija et al. | 715/736 |
| 6,915,301 | B1* | 7/2005 | Hirsch | 707/102 |

* cited by examiner

Primary Examiner—Albert W. Paladini
(74) Attorney, Agent, or Firm—McGuinness & Manaras LLP

(57) ABSTRACT

A method includes creating a network model that includes a plurality of objects that represent assets in a real world system at real world times. The network model is displayable by a geographic information system. A first object is entered in the network model. The first object is associated with a first creation date and a first expiration date at first and second real world times, respectively. A second object is entered in the network model. The second object is associated with a second creation data and a second expiration date at third and fourth real world times, respectively. A system clock in the network model is set to a fifth real world time that is between the first and third real world times. Displaying the first object and any additional objects in the network model that represent assets present in the real world system at the fifth real world time. Another method includes creating a network model that includes a plurality of objects that represent assets in a real world system at real world times. The network model is displayable by a geographic information system. Attribute data is entered at a first transaction time for a first object in the network model, and the attribute data is associated with a first real world time. Attribute data is entered at a second transaction time for the first object in the network model, and the attribute data is associated with a second real world time. A system clock in the network model is set to a third real world time that is between the first and second real world times. The first object is selected in the network model, and the attribute data associated with the first real world time is automatically displayed.

2 Claims, 23 Drawing Sheets

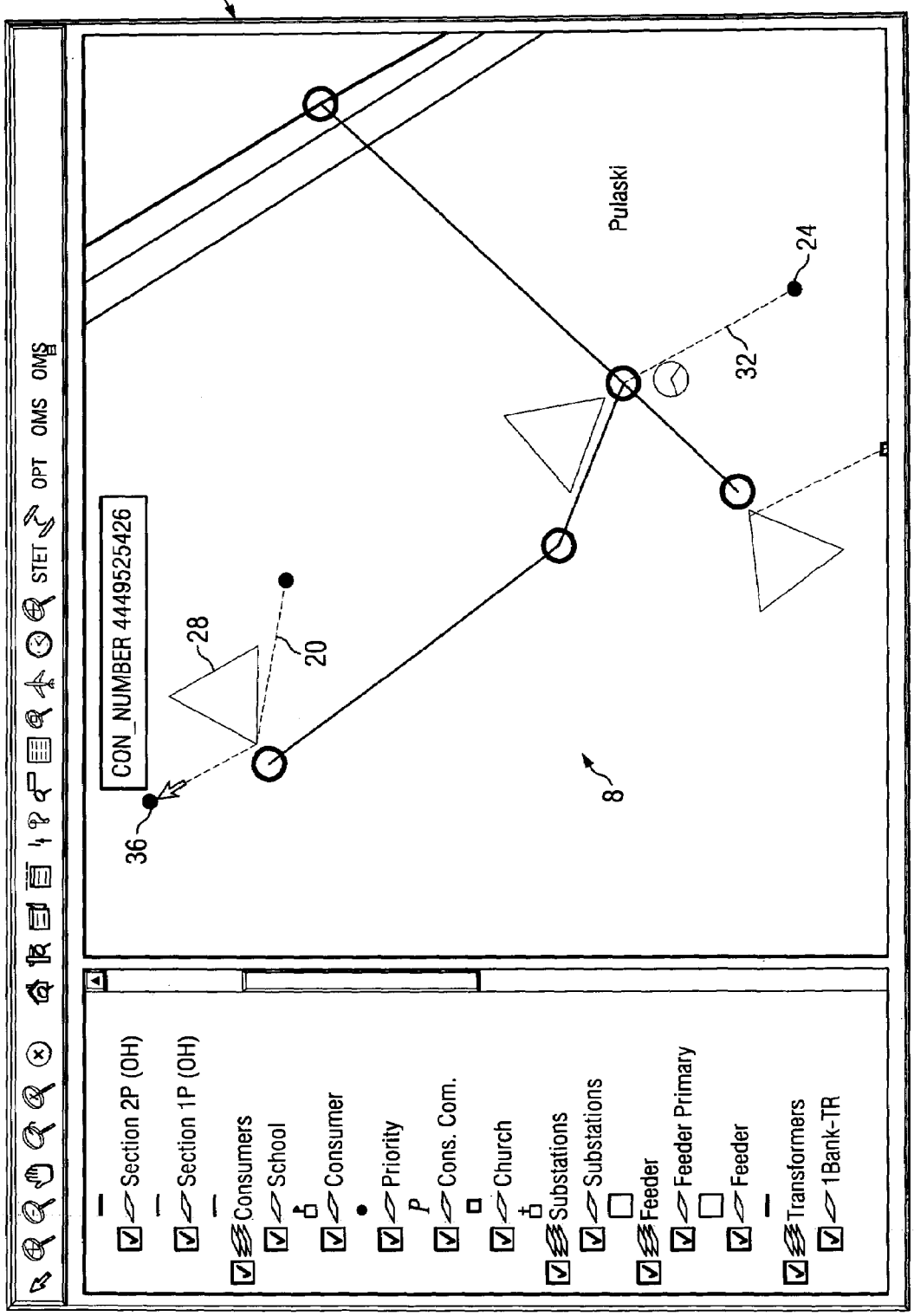

FIG. 3

View Data – Microsoft Internet Explorer

Claim statistics by Customer
- Customers
- New service drops
- Outage history
- Transformers

<4449525426>

| Description | Value |
|---|---|
| CON_NUMBER | 4449525426 |
| STATUS | 0 |
| LASTNAME | DOE |
| FIRSTNAME | JOHN |
| LIFE_SUPPORT | |
| STREET | |
| CITY | |
| STATE | |
| ZIPCODE | |
| TELEPHONE | 6066797641 |
| PRIORITYSVC | 0 |
| PLOT_NUM | 26 |
| GPS_DATE | 10/12/1999 |
| GPS_X | 1952566.25 |
| GPS_Y | 1891778.75 |
| METERNUMBER | 47658 |

1/1

Legend:
- Section 2P (OH)
- Section 1P (OH)
- Consumers
  - School
  - Consumer
  - Priority
  - Cons. Com.
  - Church
- Substations
  - Substations
- Feeder
  - Feeder Primary
  - Feeder
- Transformers
  - 1Bank-TR

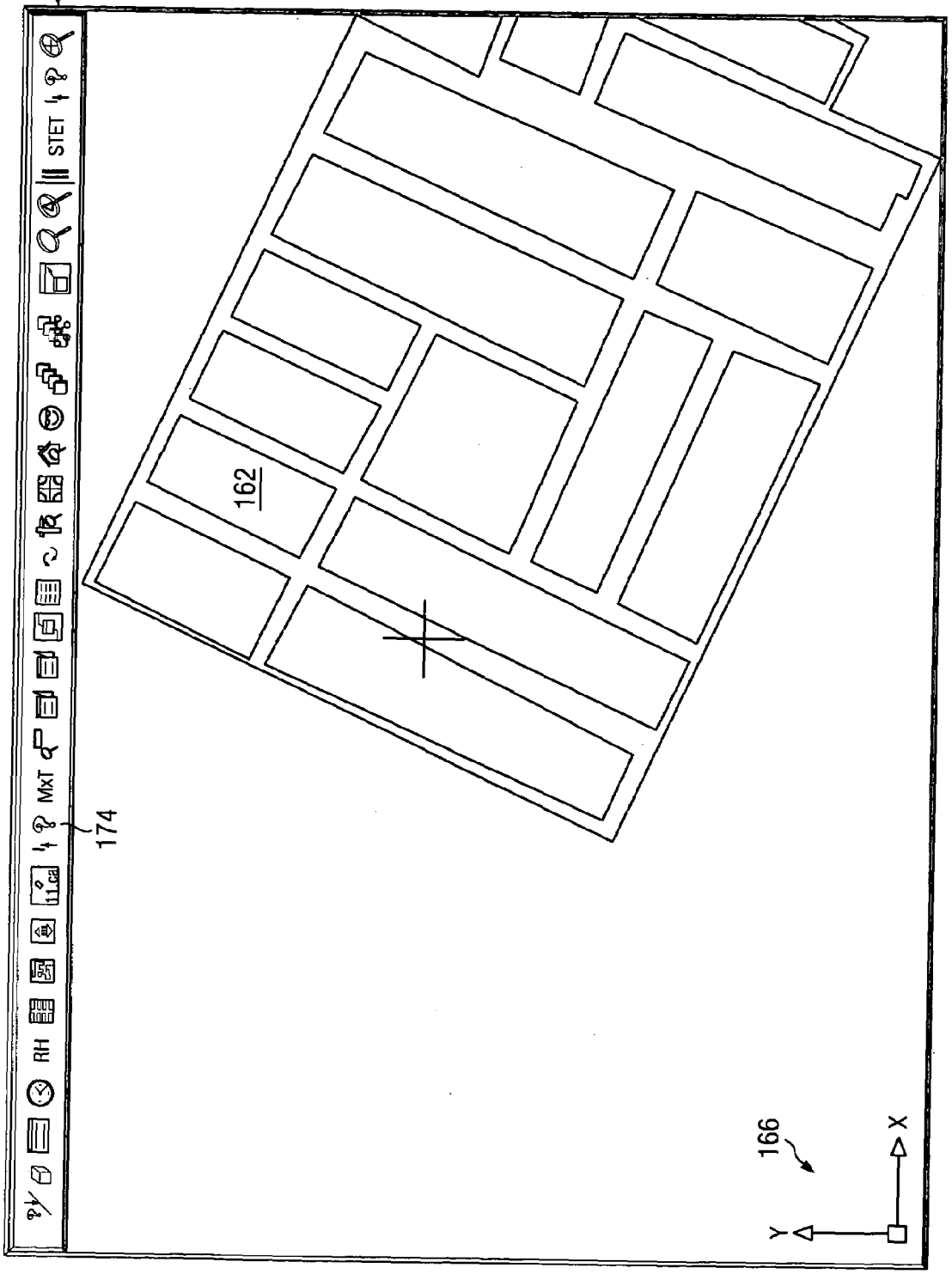

FIG. 13

| | Revenues 1999 | Revenues 2000 | Outage costs 1999 | Outage costs 2000 | Outage lost revenue |
|---|---|---|---|---|---|
| 1 | 333.47 | 463.6 | 19.31 | 3.17 | 0.69 |
| 2 | 428.83 | 576.67 | 19.45 | 6.51 | 0.62 |
| 3 | 340.94 | 86.84 | 220.42 | 138.28 | 1.41 |
| 4 | 55.94 | 418.54 | 14.29 | 3.63 | 0.89 |
| 5 | 216.1 | 267.75 | 11.02 | 3.06 | 0.75 |
| 6 | 6469.24 | 14462.19 | 88.5 | 31.5 | 8.28 |
| 7 | 405.51 | 640.19 | 17.04 | 4.88 | 0.48 |
| 8 | 16542.43 | 34726.91 | 106.4 | 32.47 | 2.18 |
| 9 | 0 | 555.83 | 23.5 | 6.56 | 6.32 |

178

Record count: 11

Microsoft Excel

| Condition | Color | Scale |
|---|---|---|
| Up to 5000 KWh | | 1 |
| 5000 to 10000 KWh | | 1 |
| 10000 to 20000 KWh | | 1 |
| 20000 to 30000 KWh | | 1 |
| 30000 to 40000 KWh | | 1 |
| More than 40000 KWh | | 1 |

Thematic Maps
- Consumptions KWh 1999
- Consumptions KWh 2000
- Outages Hs 1999
- Outages Hs 2000
- Revenues US$ 1999
- Revenues US$ 2000
- Outages Serv. Cost US$ 1999
- Outages Serv. Cost US$ 2000
- Outages Lost Rev. US$ 1999

Max.  Config n  %  No selecc.

Print records based on condition

FIG. 22

Object data for [Pilar Compact]

Object properties

| Field | Value | | Field | Value |
|---|---|---|---|---|
| Identifier: | 67011 | | Creation Date: | 4/20/2000 7:14:15 PM — 264 |
| Entity Type: | 1002 | | Delete Date: | 12/31/2021 11:59:59 PM — 268 |
| Object Type: | 12 | | X Coord: | 272041.408612 |
| Module: | 376656 | | Y Coord: | 8663823.163106 |
| | | | Design Status: | Closed (15) |
| Regeneration Date: | 1/5/2001 12:04:01 PM | | Actual Status: | Closed (15) |

Attributes:

| ID | Description | Value | Created | Deleted |
|---|---|---|---|---|
| 1000 | Substation ID | 1111 | 4/20/2000 7:14:15 PM | 4/20/2000 7:14:15 PM |
| 1001 | Sec Substation Power | 400 | 4/22/2000 7:14:15 PM | 12/31/2021 11:59:59 PM |
| 1000 | Substation ID | 07896C | 4/23/2000 7:14:15 PM | 12/31/2021 11:59:59 PM |
| 3039 | Operating Device Address | Albania 375 | 4/23/2000 10:31:28 PM | 12/31/2021 11:59:59 PM |

Legend: Active to reg. date | Active | Inactive

History | Operations

FIG. 23

| External Links | | | | | |
|---|---|---|---|---|---|
| Commercial System | Custome | Rate | Power | Power | Contract | Contract | Billing Date |
| Technical System | 381752 | BT5 | 580 | 0 | 7.6 | 0 | 12/12/1999 |
| Outages | 381752 | BT5 | 690 | 0 | 7.6 | 0 | 11/11/1999 |
| Consumption detail | 381752 | BT5 | 670 | 0 | 7.6 | 0 | 10/12/1999 |
| Consumption Year Sumry. | 381752 | BT5 | 550 | 0 | 7.6 | 0 | 9/10/1999 |
| Revenue Analysis (Cummulative) | 381752 | BT5 | 467 | 0 | 7.6 | 0 | 8/11/1999 |
| Outage Analysis (Cummulative) | 381752 | BT5 | 571 | 0 | 7.6 | 0 | 7/7/1999 |
| | 381752 | BT5 | 399 | 0 | 7.6 | 0 | 6/10/1999 |
| | 381752 | BT5 | 447 | 0 | 7.6 | 0 | 5/12/1999 |
| | 381752 | BT5 | 459 | 0 | 7.6 | 0 | 4/13/1999 |
| | 381752 | BT5 | 465 | 0 | 7.6 | 0 | 3/11/1999 |
| | 381752 | BT5 | 432 | 0 | 7.6 | 0 | 2/10/1999 |
| | 381752 | BT5 | 485 | 0 | 7.6 | 0 | 1/12/1999 |

<381752>

12/12        Billing Date

Select linked item group of elements

FIG. 24

| Customer | Rate | Power | Power | Contract | Contract | Billing Date |
|---|---|---|---|---|---|---|
| 381752 | BT5 | 543 | 0 | 7.6 | 0 | 12/12/2000 |
| 381752 | BT5 | 603 | 0 | 7.6 | 0 | 11/11/2000 |
| 381752 | BT5 | 747 | 0 | 7.6 | 0 | 10/12/2000 |
| 381752 | BT5 | 915 | 0 | 7.6 | 0 | 9/10/2000 |
| 381752 | BT5 | 967 | 0 | 7.6 | 0 | 8/11/2000 |
| 381752 | BT5 | 846 | 0 | 7.6 | 0 | 7/10/2000 |
| 381752 | BT5 | 799 | 0 | 7.6 | 0 | 6/10/2000 |
| 381752 | BT5 | 647 | 0 | 7.6 | 0 | 5/12/2000 |
| 381752 | BT5 | 559 | 0 | 7.6 | 0 | 4/13/2000 |
| 381752 | BT5 | 730 | 0 | 7.6 | 0 | 3/11/2000 |
| 381752 | BT5 | 720 | 0 | 7.6 | 0 | 2/10/2000 |
| 381752 | BT5 | 710 | 0 | 7.6 | 0 | 1/12/2000 |

4DL Time Dimension control
1/5/2001 12:04:01 PM

246

12/12

Rate type

FIG. 25

| | Entity ID | Cust ID | KWh 1999 | KWh 2000 | US$ 1999 | US$ 2000 |
|---|---|---|---|---|---|---|
| 1 | <62724144> | 369074 | 2339 | 1780 | 128.65 | 97.9 |
| 2 | <62725472> | 369072 | 2823 | 4600 | 155.27 | 253 |
| 3 | <62735488> | 369071 | 2004 | 3027 | 110.22 | 166.48 |
| 4 | <62738448> | 369069 | 2073 | 2690 | 114.02 | 147.95 |
| 5 | <62740784> | 369070 | 2171 | 4050 | 119.4 | 222.75 |
| 6 | <62743120> | 369067 | 2043 | 27419 | 112.36 | 1508.04 |
| 7 | <62744288> | 369068 | 2250 | 2500 | 123.75 | 137.5 |
| 8 | <62745456> | 369075 | 2517 | 2290 | 138.44 | 125.95 |
| 9 | <62748976> | 369076 | 2359 | 3289 | 129.74 | 180.9 |
| 10 | <62756688> | 393273 | 21005 | 53610 | 1155.29 | 2948.54 |

Record count: 115

Sum: 281728.000 — 284

Average: 2449.809 — 288

280

Thematic Maps

Microsoft Excel

METHOD FOR MODELING AND VIEWING REAL WORLD OBJECTS IN A NETWORK MODEL AT REAL WORLD TIMES

This application claims the benefit of U.S. Provisional Application No. 60/385,168, filed May 31, 2002.

BACKGROUND OF THE INVENTION

1. Field of the Invention

This invention relates generally to a network model for a geographically distributed real world system, and, more particularly, to a method for modeling and viewing real world objects in the network model at real world times.

2. Description to the Related Art

A number of complex geographically distributed systems exist that are capable of being characterized by a network model. These systems typically include gas distribution, cable television, facility management, electric utilities, telecommunication, water and sewer treatment, or any other system capable of providing services to customers scattered over a large geographic area. These systems usually include a number of system assets or resources that are placed throughout a geographic region or area.

In one illustrative system, for example, a water and sewage treatment facility may include lift stations, pumps and pipes strategically placed throughout a neighborhood or county. A telecommunication system may include switches, central offices, cables, and multiplexers placed in strategic geographic locations for enabling communications in a given area. Likewise, an electric utility system may include poles, transmission lines, distribution lines, transformers, substations, and meters for providing power to geographically distributed customers.

In a typical system, a majority of the system assets and resources are connected to enable the provision of services or product to the system's customers. For an electric utility, a substation may be connected to a transformer, and the transformer may be connected to a meter to provide power to an end user of the system. It should be appreciated that the connections in a system may be one-to-one, one-to-many, many-to-many, etc. In the electric utility example, a transformer may be connected to a single meter (one-to-one), or the transformer may be connected to several meters (one-to-many).

As time passes, geographically distributed systems typically evolve, and the connections between system assets change. For example, the topology in a system may change as new assets are added to the system and when assets are removed. The connection of system assets may also change for design reasons or simply when new customers are added.

As described above, a network model may be used to characterize a geographically distributed system. That is, a network model may be used to represent or model a system, such as an electric utility, that inherently includes geographic information. The network model for these types of systems typically includes a map-driven interface that geographically displays system information. System assets may be represented as objects in the network model, and the objects may include user definable attributes. For example, with an electric utility, different components of a power distribution system may be superimposed on a map-driven interface as objects. Using a graphical user interface (GUI), the map-driven interface may be displayed, and a user may graphically access system information.

In one illustrative embodiment, a network model may be used to represent a gas distribution system. The objects in the network model may include distribution pipes, gas meters, compressors, dryers, or any other real world asset present in the gas distribution system. A compressor, for example, may be represented as an object on the map-driven interface, and the attributes of the compressor may include, compressor type, throughput, location, identification number, connectivity, or any other useful information defined by the user.

Network models of geographically distributed systems serve a number of useful purposes. A network model representing a real world system may be used to assist system designers in planning and designing improvements to the system. The network model may be used to assist in localizing and resolving outages or other customer service issues. The network model may be used to assist planners in balancing system loads and other requirements. The network model may be used to predict system operating parameters. In short, geographically distributed systems are often large and complex. These systems typically include numerous interrelated assets used to provide services to geographically distributed customers. The network model may be used to simplify tasks associated with these real world systems.

The importance of network models has increased with the current economic environment. With the deregulation of key industries, such as power and telecommunication, the competitive environment in these fields has intensified. Customers of these systems demand improved quality of service at lower prices. In addition, recent mergers and acquisitions have also changed the competitive landscape. More so than ever, owners and operators of geographically distributed systems must deploy and manage their system's assets as efficiently as possible. A network model is an essential tool in accomplishing this goal.

Unfortunately, traditional network models are not well suited for meeting the challenges associated with modeling complex geographically distributed systems. Traditional network models are often complex and difficult to operate. Updating the network model is usually a long arduous process that is cumbersome and requires a trained professional.

Updating information in a traditional network model becomes particularly problematic in multi-user environments. This is because changes usually require recompiling the model. In other words, changes in the network model are not dynamically incorporated. Instead, the changes become accessible only after a recompiling process or updating script is executed, which usually requires temporarily taking the network model offline.

Traditional network models do not account for the time-centric nature inherent in geographically distributed systems (i.e., traditional network models do not adequately account for or focus on the aspect of time.) As described above, system assets are represented by objects in a network model. These objects have attributes that are defined by the users of the network model. To accurately represent the real world system over time, the objects should include the ability to evolve in the network model, as do the real world system assets they represent. Moreover, this evolution should be historically tracked and capable of recall by the network model. Likewise, the connectivity between objects (i.e., topology) should also evolve in the network model, as do the connections between assets in the real world system.

Traditional network models do not adequately support historical investigative activities. Users of these traditional modeling systems are unable to recall logical (schematic) and/or physical (geographic) views of the network from any selected point in time. In other words, traditional network models may allow users to set object attributes and define their connectivity within the network model, but there is no synchronization of these events with when they occurred real time in the real world system they are intended to model.

In short, a more intelligent and comprehensive network model would be capable of tracking and representing the real world system, as it existed in real time. Attribute values of objects and their connectivity should evolve in the model, and the state of the network (e.g., logical, physical, etc.) should be recallable by the user, as it existed real time in the real world system.

The present invention is directed to overcoming, or at least reducing the effects of, one or more of the problems set forth above.

SUMMARY OF THE INVENTION

In one aspect of the invention a method is provided. The method includes creating a network model that includes a plurality of objects that represent assets in a real world system at real world times. The network model is displayable by a geographic information system. A first object is entered in the network model. The first object is associated with a first creation date and a first expiration date at first and second real world times, respectively. A second object is entered in the network model. The second object is associated with a second creation data and a second expiration date at third and fourth real world times, respectively. A system clock in the network model is set to a fifth real world time that is between the first and third real world times. Displaying the first object and any additional objects in the network model that represent assets present in the real world system at the fifth real world time.

In another aspect of the invention a method is provided. The method includes creating a network model that includes a plurality of objects that represent assets in a real world system at real world times. The network model is displayable by a geographic information system. Attribute data is entered at a first transaction time for a first object in the network model, and the attribute data is associated with a first real world time. Attribute data is entered at a second transaction time for the first object in the network model, and the attribute data is associated with a second real world time. A system clock in the network model is set to a third real world time that is between the first and second real world times. The first object is selected in the network model, and the attribute data associated with the first real world time is automatically displayed.

BRIEF DESCRIPTION OF THE DRAWINGS

The invention may be best understood by reference to the following description taken in conjunction with the accompanying drawings, in which like reference numerals identify like elements, and in which:

FIG. 2 is a more detailed view of the network model illustrated in FIG. 1;

FIG. 3 is a table illustrating attribute data for an exemplary object shown in the network model of FIG. 2;

FIG. 11 is an illustrative network model for an electric utility system;

FIG. 13 is an extension of the table shown in FIG. 12;

FIG. 22 is a table illustrating attribute data for an object shown in FIG. 21 at a selected real world time in accordance with one aspect of the present invention;

FIG. 23 illustrates attribute data for a service point in the network model at a first selected real world time in accordance with one aspect of the present invention;

FIG. 24 illustrates attribute data for the service point in FIG. 23 at a second selected real world time in accordance with one aspect of the present invention; and FIG. 25 illustrates attribute data for multiple service points in the network model at a selected real world time in accordance with one aspect of the present invention.

Figure 1:
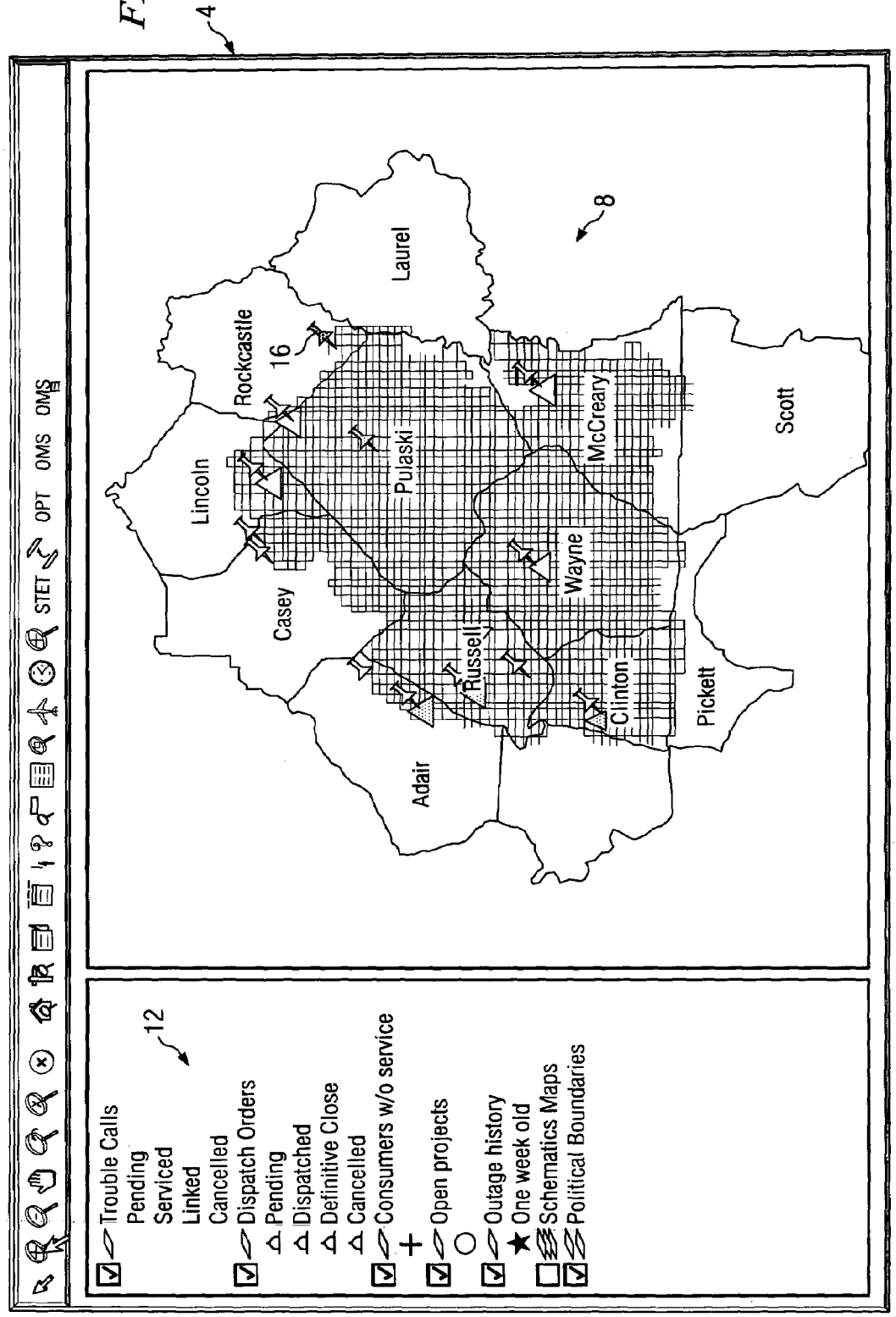
FIG. 1 is an illustrative network model of an electric utility system.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

A network model may be used to represent, view, and track geographically distributed real world systems, such as cable television, telecommunications, water and sewer treatment, gas distribution, facilities management, electric utilities, and the like. These real world systems typically include a number of resources or system assets that may be represented in a network model as objects. It is intended in the following discussion that the terms assets, system assets, and resources are to be used interchangeably when describing the present invention.

A network model may include a map-driven interface that geographically displays the objects superimposed on a map. In one illustrative embodiment, the objects may be created in the network model using an object oriented programming environment. In short, using a network model, system resources or assets may be modeled by digital counterparts, within any form of a computational system.

Objects in the network model vary depending upon the type of real world system being modeled. Referring to FIG. 1, an illustrative network model 4 is shown for an electric utility. In this example, the network model 4 represents the geographically distributed electric utility system, and the network model 4 is displayed using a map-driven graphical interface 8. Several layers of information 12 are available in the network model 4, which may be displayed using any number of map-driven software packages. It should be appreciated that any number of hardware systems and software systems may be used to create and operate the network model 4 and that the particular selection may vary as a matter of design choice. In this illustrative example, Autodesk's MapGuide Platform Viewer has been selected, and the network model 4 is accessible to a user operating a web-browser on a thin client.

The map-driven interface 8 in this example is drillable, allowing a user to graphically select through the network model 4 and display any level of desired detail. Icons 16 indicate marked areas of interest. Although not shown in this view, system assets represented in the network model 4 may include substations, poles, transmission lines, distribution lines, transformers, meters, or any other asset.

Referring to FIG. 2, a more detailed view of the network model 4 is shown. As described above, to achieve this level of detail, a user may drill down through the network model 4 using the map-driven interface 8 and select a specific area of interest. In the consumer-level view shown in FIG. 2, a number of objects 20 are viewable, such as customers 24, transformers 28, secondary conductors 32, etc. In this example, a first object 36 is shown modeling a customer having a customer identification number of '4449525426'. The objects 20 modeling customers are intended to represent utility meters in the real world system.

In the network model 4, objects 20 may include any number of user definable attributes. Referring to FIG. 3, if the first object 36 is selected, a table 40 is shown displaying a number of attributes. It should be appreciated that first object 36 may be defined to include any number of attributes and that the attributes selected for objects 20 in the network model 4 may vary depending upon the particular application of the present invention. In this example, the attributes of the first object 36 (a customer in the network model) include customer identification number 44, customer information (e.g., last name, street, etc.), meter number 48, telephone number 52, etc. Alternatively, if a network model is used to model a gas distribution system, objects may be defined to represent real world assets, such as compressors, dryers, pipes, flow meters, valves, or any other element within the real world system.

A time element may be associated with objects 20 in the network model 4. The time element may be used to track the object's attributes as they evolve over time. Objects having a time element associated therewith may be referred to as evolutionary objects because the attributes of these objects change, and the attribute values are determined at a given time "t". By tracking objects as they evolve over time, trends can be spotted, and the system may be modeled at any selected real world time "t".

In the following discussion, all objects referred to should be considered evolutionary objects. However, it should be appreciated that static objects may be included in the network model 4 along with the evolutionary objects. That is, some objects 20 in the network model 4 may include only static attributes that do not change over time. Hereafter, the term "object" by itself is intended to mean an evolutionary object.

An evolutionary object may include a number of properties, such as native attributes, temporal attributes, and relationship attributes. Some or all of the perceived attributes of an evolutionary object change or evolve over time. The state of an evolutionary object at a certain point in time is defined by a specific set of attribute values, at a certain moment along its lifetime. Algebraically, the evolutionary object may be represented in equation [1] as follows:

$$S_{o_t} = f(\alpha_{1_t}, \alpha_{2_t}, \alpha_{3_t}, \ldots \alpha_{p_t}) \quad [1]$$

Where:
$S_{o_t}$ = state of object type "o" at time "t"
$\alpha_{i_t}$ = value of attribute "$\alpha_i$" at time "t"
p = number of attributes that define the perceived status of object "o".

A more generic form for evolutionary objects is shown algebraically in equation [2] as follows:

$$S_o(t) = f[\alpha_1(t), \alpha_2(t), \alpha_3(t), \ldots \alpha_p(t)] \quad [2]$$

Where:
$S_{o_t}$ = state of object type "o" at time "t"
$\alpha_i$ = value of attribute "$\alpha_i$", also a function of time variable "t"
p = number of attributes that define the perceived status of object "o".

An object's native attributes represent those object characteristics that are either time-invariant or a temporal. Temporal attributes are those attributes that change over time.

In the electric utility example described above, the first object 36 represents a customer in the network model 4. A customer 24 in the network model 4 typically represents a meter in the real world system. In this example, the meter may be measuring power provided to a dwelling or residence. In the real world system, certain characteristics of the meter change over time. These changes in real world characteristics are modeled by the temporal attributes of the object.

In FIG. 3, the first object 36 is modeling a real world meter. The attributes relating to customer information (e.g., LASTNAME, TELEPHONE, etc.) will likely change, for example, as the owner or tenant of the residence changes. These attributes are considered to be temporal attributes. The attribute 'METERNUMBER', however, is a native attribute of the first object 36 because its value is static (i.e., not changing over time).

Objects having native and temporal attributes may be understood algebraically as shown in equation [3]:

$$S_o(t) = f[k_1, k_2, \ldots, k_n, \theta_1(t), \theta_2(t), \ldots \theta_p(t)] \quad [3]$$

Where:

$S_{o_t}$ = state of object type "o" at time "t"

$k_i$ = value of native attribute "$k_i$"

$\theta_j$ = value of temporal attribute "$\theta_j$", and it is a function of time variable "t".

Temporal attributes can take any functional form or expression, be it discrete multi-valued (e.g., singe, married, divorced, etc.), discrete infinite (e.g., 10 KVA, 33 KVA, 65 KVA, etc.), real infinite (e.g., 1.45, 1.78, 1.82, etc.)

n = number of native attributes that define perceived status of object "o"

p = number of temporal attributes that define perceived status of object "o"

As shown in equation [3], a temporal attribute is a function of time "t". Based on this, if tracked over time, the values of a temporal attribute may take the form of an independent variable enabling a curve fit to determine the algebraic expression for the temporal attribute. If the functional expression of the attribute is known, it is possible to predict or anticipate the attributes value for future points in time.

Evolutionary objects often also include relationship attributes. As with temporal attributes, relationship attributes may change over time. As described above, relationship attributes may be one-to-one, one-to-many, etc. In a network model for a real world electric utility, for example, a transformer may be connected to many different meters, which implies a one-to-many relationship. Over time, as new meters are connected and disconnected to/from the transformer in the real world system, the relationship attribute of the object modeling the transformer's connectivity evolves to track these changes. Because a time element is associated with objects in the network model, attribute values, including relationship attributes, may be recalled at any selected point in time. This time-centric feature of the network model is further described below.

In addition to changing characteristics, real world assets usually have finite lives within a given system. That is, in a typical example, a real world asset is added to a system, and after some service period or lifecycle, the asset is removed from the system. To accurately track the real world system, in one illustrative embodiment, the network model accounts for these changes in the real world system in real time.

Figure 4:
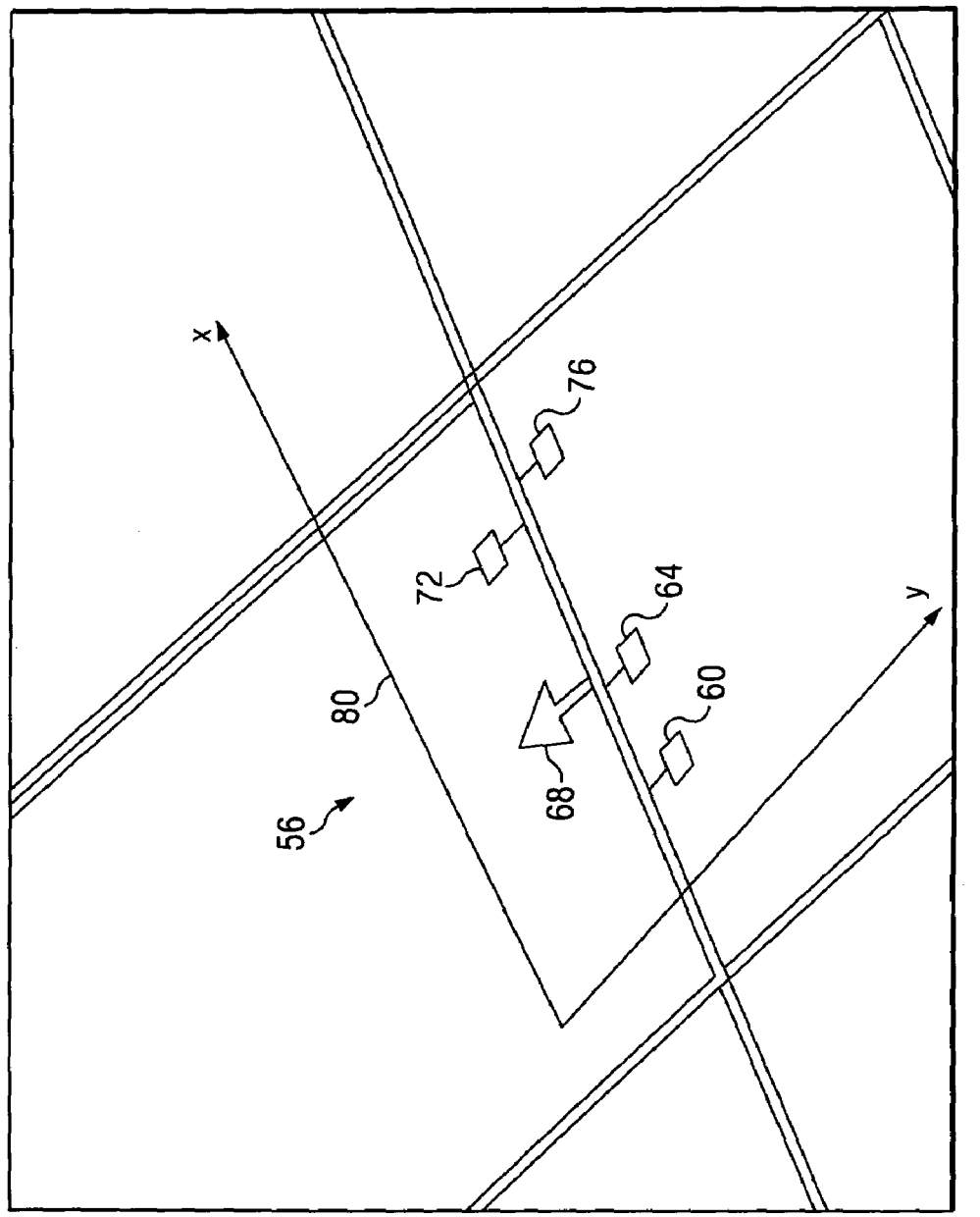
FIG. 4 is a network model illustrating objects plotted in a Cartesian coordinate system.

Referring to FIG. 4, a network model 56 is shown illustrating a first object 60, a second object 64, a third object 68, a fourth object 72, and a fifth object 76 plotted in a Cartesian coordinate system 80. If the element of time were not present in the network model 56, the model 56 would not be able to track objects present in the real world system at a given point in time.

Figure 5:
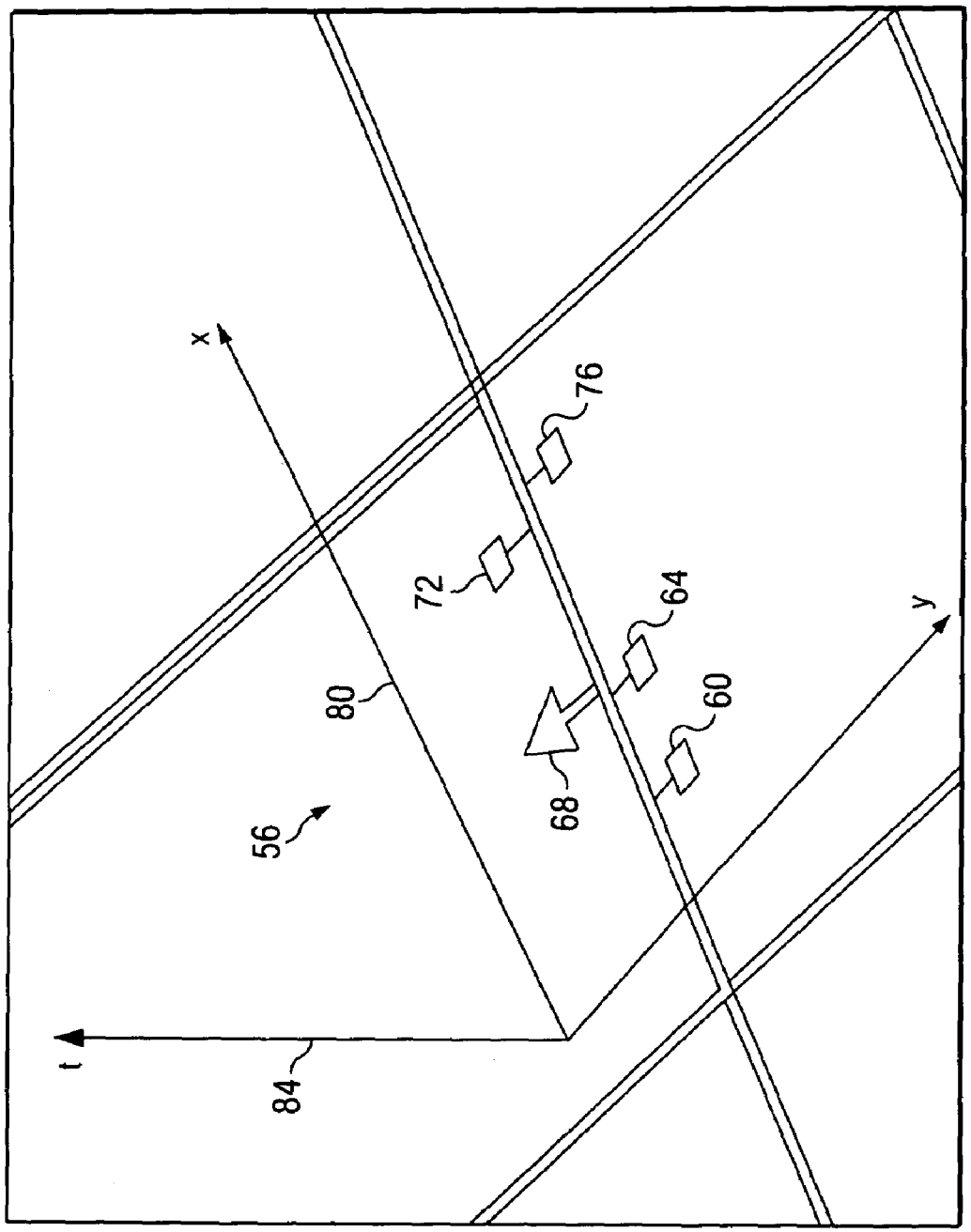
FIG. 5 is a time-centric representation of the network model shown in FIG. 4 in accordance with one aspect of the present invention.

In FIG. 5, a time-centric representation of the network model 56 is shown (i.e., the fourth dimension of time 84 has been added to the network model 56.) When objects are created in the network model 56, a creation date and an expiration date may be assigned to the objects. The creation date represents the real world time an asset was added to the real world system. The expiration date represents the date the asset was removed from the real world system. By associating this information with the objects (60, 64, 68, 72, and 76), the network model 56 is able to model the logical and physical layout of the real world system at real world points in time. In other words, by tagging the objects (60, 64, 68, 72, and 76) with creation and expiration dates, the network model 56 is able to recreate and model the system at any selected point in time.

Figure 6:
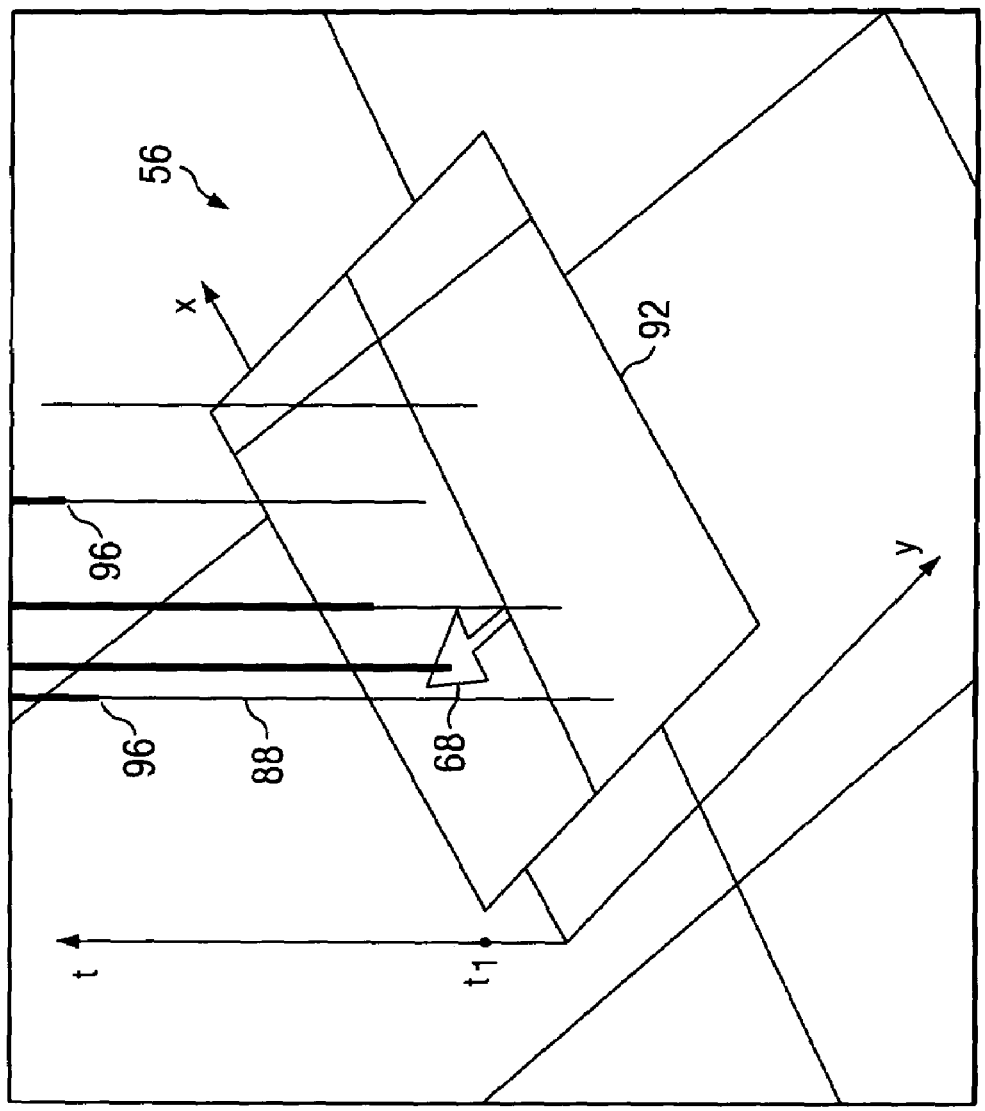
FIG. 6 is a second time-centric representation of the network model shown in FIG. 4 in accordance with one aspect of the present invention.

To illustrate one aspect of the time-centric feature of the network model 56, in FIG. 6, creation dates and expiration dates of the objects are pictorially represented using timelines 88. A timeline 88 is shown for each object (60, 64, 68, 72, and 76). At selected time $t_1$, represented by a constant time plane 92, only the third object 68 is present in the network model 56. This is because at real world time $t_1$ the only asset present in the real world system is the asset represented by the third object 68. A creation date 96 is illustrated for the first and forth objects 60, 72 in the network model 56.

Figure 7:
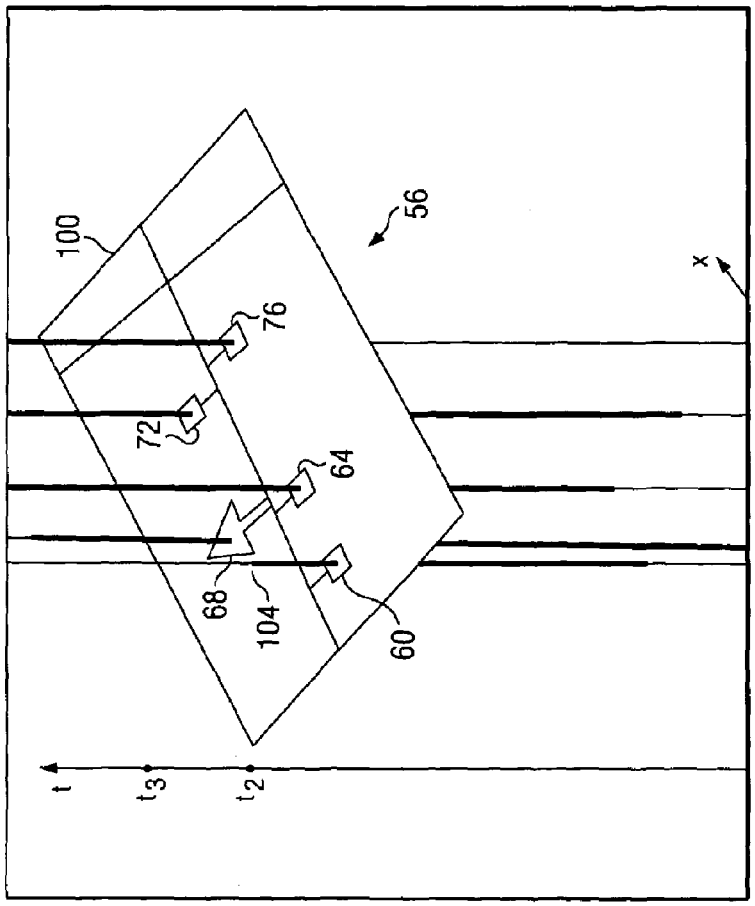
FIG. 7 is a third time-centric representation of the network model shown in FIG. 4 in accordance with one aspect of the present invention.

Referring to FIG. 7, the network model 56 is shown at selected time $t_2$. At time $t_2$, represented by a constant time plane 100, all the objects (60, 64, 68, 72, and 76) are present in the network model 56. This is because at real world time $t_2$ the assets represented by the objects are present in the real world system. An expiration date 104 is shown, however, for the first object 60 at time $t_3$. At time $t_3$, the real world asset modeled by the first object 60 was removed from the real world system. If the system clock is moved forward past $t_3$, the first object 60 will no longer appear in the network model 56. As illustrated, by moving the system clock forwards and backwards in the network model 56, the real world system may be modeled at the selected real world time.

Figure 8:
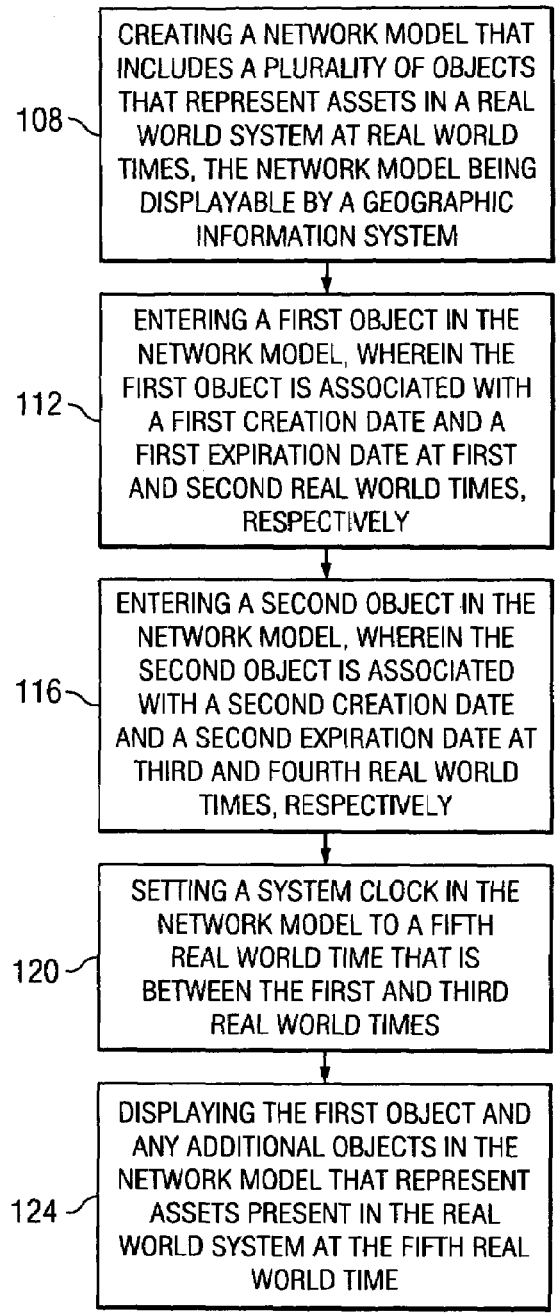
FIG. 8 is a simplified block diagram illustrating one exemplary process in accordance with one aspect of the present invention.

Referring to FIG. 8, an illustrative method for modeling a real world system is shown. At block 108, a network model is created that includes a plurality of objects that represent assets in a real world system at real world times. As described above, the network model may be displayed using a geographic information system that includes a map-driven interface.

The network model may be created using a number of different programming methods and may be executed on any number of hardware systems. In one embodiment, the network model is created using an object oriented programming environment (e.g., Java, C++, etc.) and is stored on an IBM compatible server that is accessible by any number of clients.

At block 112, a first object is entered in the network model and is associated with a first creation date at a first real world time. The object is also associated with an expiration date at a second real world time. The second real world time follows the first real world time.

When an asset is added to a real world system, it is represented in the network model by an object. The object is associated with a creation date attribute that corresponds to the date the asset was added to the real world system. The object is also associated with an expiration date attribute.

The expiration date attribute may be set to a time that the asset is anticipated to be removed from the real world system. Generally, however, since it is usually not known how long the asset will function in the system, the expiration date is set to an infinite time period. Since the expiration date is set to an infinite value, the object is displayed in the network model for all points in time after the creation date. When the asset is removed from the system, the expiration date attribute for the object is updated to reflect the appropriate real world time. If the system clock in the network model is then set to a date following the expiration date of the first object, the first object will not be displayed by the network model. Likewise, if the system clock is set to a date prior to the creation date, the first object will not be displayed by the network model.

At block 116, a second object is entered in the network model. The second object is associated with a second creation date at a third real world time. The second object is also associated with a second expiration date at a fourth real world time.

At block 120, a system clock in the network model is set back to a fifth real world time that is between the first and third real world times. The network model includes a user selectable system clock. The system clock may be moved forwards and backwards depending upon where in real world time the user would like to model the real world system. For example, if the first real world time was Jan. 22, 1988 (first creation date) and the third real world time was Aug. 5, 2001 (second creation date), the system clock in the network model is set anywhere in-between these dates (e.g., Jul. 19, 1992, Mar. 6, 1994, Oct. 25, 1988, etc.) The system clock is selectable to any point in time. In addition, multiple users may simultaneously access the network model from different clients and model the real world system at different real world times.

At block 124, the first object and any additional objects in the network model that represent assets present in the real world system at the fifth real world time are displayed. The network model recreates and models the real world system at the selected time. By setting the system clock past the creation date for the first object but before the creation date of the second object, the second object is excluded from display. This is because the asset being modeled by the second object was not present in the real world system at the selected time.

In addition to modeling the logical and physical characteristics of the real world system at the selected real world time, the attributes of the objects in the network model derive their values from the selected real world time. For instance, in the electric utility example above, if the CON_NUMBER attribute of the first object 36 (see FIG. 3) is set to '4449525426' at a first real world time, but is later changed to '4428725426' at a second real world time, the attribute value for CON_NUMBER provided by the network model 4 will vary depending on the selected real world time. For example, if the system clock (not shown) is set anywhere between the first real world time (inclusive) and the second real world time (exclusive), the network model 4 will display '4449525426' when the first object 36 is selected. Alternatively, if the system clock is set from the second real world time on, the attribute value for CON_NUMBER will be '4428725426' when the first object 36 is selected. As such, when the network model 4 is adjusted backwards or forwards by changing the system clock, what is produced is not only the objects 20 that are "alive" at the selected real world point in time, but also the configuration (i.e., attribute data) of the objects 20 at the selected time.

Figure 9:
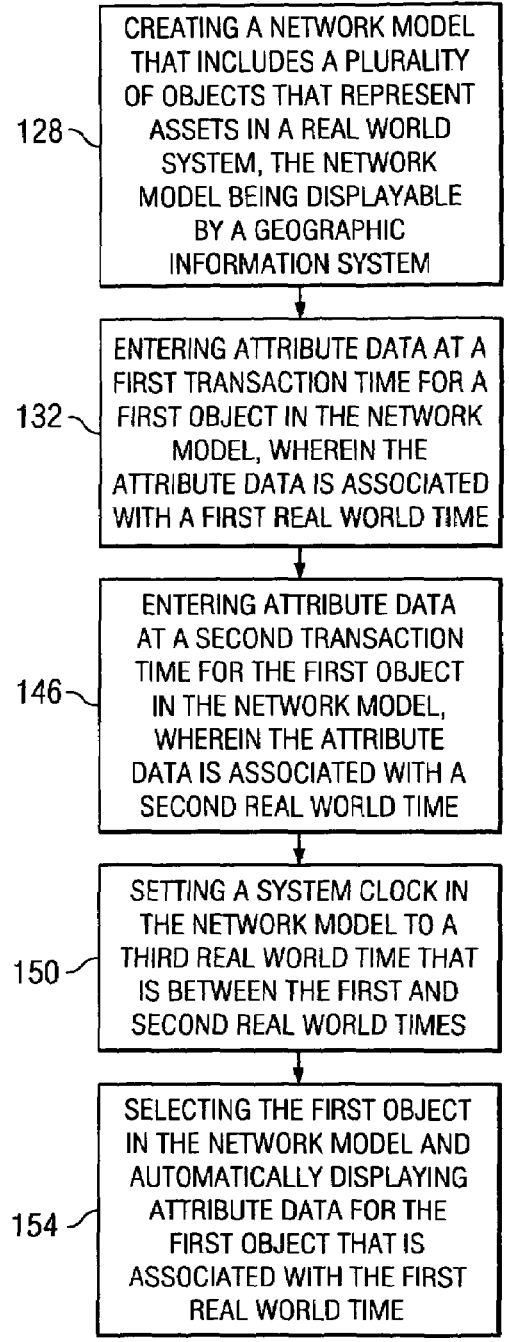
FIG. 9 is a simplified block diagram illustrating a second exemplary process in accordance with one aspect of the present invention.

Referring to FIG. 9, an illustrative method for modeling assets in a real world system with objects having attribute values associated with real world times is shown. At block 128, a network model is created that includes a plurality of objects that represent assets in a real world system at real world times. As described above, the network model may be displayed using a geographic information system that includes a map-driven interface.

At block 132, attribute data is entered at a first transaction time for a first object in the network model. The attribute data is associated with a first real world time. When attribute data is entered for an object, the user selects what real world time to associate with the data.

Figure 10:
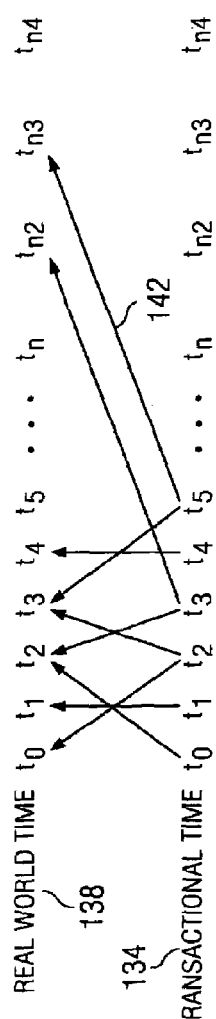
FIG. 10 is an exemplary timeline illustrating the relationship between transaction times and real world times in accordance with one aspect of the present invention.

Referring to FIG. 10, hypothetical transactional times 134 and real world times 138 are illustrated for a network model representing a real world system. The transactional times 134 are the actual points in time data is entered in the network model. The real world times 138 relate to time in the real world system. FIG. 10 illustrates that the network model is able to accept transactions that are out-of-sync (i.e., transactional time 134 is different than real world time 138.) For example, in FIG. 3, the attribute CON_NUMBER was entered for the first object 36 at a certain transactional time. The attribute though may be associated with a real world time that is different from the transactional time. This asynchronous transaction model is illustrated with arrows 142 originating at transaction times 134 and ending at real world times 138. For example, if attribute data is entered at transactional time $t_2$, the attribute data may be associated with real world time $t_0$ or a later real world time $t_3$.

This is an important feature with real world modeling because it is very difficult to input data into a model the instance it happens in the real world. That is, when changes occur in the real world system, it may be some time before the network model is updated to reflect the changes.

The asynchronous model, pictorially illustrated in FIG. 10, allows data to be added to the network model in a non-chronological order. Because any real world time 138 may be associated with the entered data, changes in the real world system may be added to the network model at any time. This is done without having to recompile or take the network model offline. Instead, postings to the network model are dynamically added to a database, and the network model searches the database when the system clock is changed. To maintain consistency, the network checks to ensure that data posted back in time is consistent with what the network looked like at that point in real world time.

Referring to the electric utility example in FIGS. 1 and 2, if the network model 4 is to be updated with a meter (not shown) that was installed in the real world system three weeks ago, it is likely that a conductor connected the meter to a pole or transformer. If the transformer or pole the meter was connected to have not yet been added to the network model 4, the transaction attempting to add the meter to the network model 4 will be denied, and the operator is informed that the transaction is inconsistent with the state of the network 4 at the selected real world time. This integrity check insures the consistency of the network model 4.

Referring back to FIG. 9, and particularly to block 132, the user may select and associate with attribute data any desired real world time, such as the current date, past dates, and future dates, so long as the selected time does not adversely affect the consistency of the network model. For example, the user may not associate real world time with attribute data that precedes the creation date of the object, or follows the expiration date. This would adversely impact the consistency of the network model, and the attempted posting would be denied. Other date validations exist for every update to the time centric model to avoid inconsistencies or "time paradoxes".

The network model not only ensures consistency at the selected real world time, but for any selected range of real world times. In other words, an update could be made that leaves the model consistent at the selected real world time but inconsistent for later times. This is best illustrated by an example. In one illustrative embodiment, a first asset capable of only one-to-one or stand alone connectivity is added to a real world system at time $t_0$. This addition is added to the network model at the real world time. At time $t_2$, the first asset is connected in the real world system to a second asset. This change is also entered in the real world system at the real world time. Now, suppose an additional connection for the first object is attempted for real world time $t_1$, which is between $t_0$ and $t_3$ (i.e., $t_0<t_1<t_3$). If the network model only validates the transaction attempting to post the additional connection at time $t_1$, the transaction would pass because the first object's existing connection does not occur until time $t_3$. The network model, however, may be configured to maintain the consistency of the model across any range of real world times, and if the network model was configured, for example, to maintain consistency for all real world times, the attempted transaction would be denied.

The asynchronous model permits multiple users in a distributed system to post transactions simultaneously, provided that the data being entered is consistent with the state of the network at the selected real world time (i.e., the data passes the integrity check performed by the network model). In a multi-user environment, a first user may be posting a transaction as it happen three weeks ago, while a second user is posting a transaction as it happen two days ago and a third user is posting a transaction that took place in the real world system two months ago. Because the network model permits asynchronous postings, these transactions may occur simultaneously. It is difficult to post data to a network model in a chronological order. If the transaction does not disrupt the consistency of the network any user can post transactions at any time, going back and forth in time in an unorderly fashion.

As described above, the network model may be created using an object oriented programming environment, such as Java and C++. Any number of databases may be used to store data entered into the network model. In one embodiment, the network model may be configured to operate with Informix, Oracle, Access, MS SQL Server, and the like. A number of factors, such as scalability, programmability, extensibility, may be considered when selecting a particular database, and the particular database selected may vary as a matter of design choice.

It should be appreciated that any number of programming algorithms and techniques may be used to implement the above described network model. In one illustrative embodiment, object attributes may be stored in a database table having a plurality of records and fields. When a user updates an object with attribute data at a selected real world time, a new record may be stored in the table, and the record may include a field for the selected real world time. Likewise, the table may also include a field for the object's creation date and a field for the object's expiration date.

Continuing with this illustrative example, when the network model is displayed for a selected real world time, the tables are searched, and the network model selects objects that are "alive" at the selected real world time. For example, the network model will display objects having a creation date that precedes the selected real world time and an expiration date that follows the selected real world time. Because real world time is associated with object attributes, the network model is able to search the tables and make available the appropriate attribute data for the objects at the selected real world time.

Referring back to FIG. 9, at block 146, attribute data is entered at a second transaction time for the first object in the network model. The attribute data is associated with a second real world time.

At block 150, a system clock in the network model is set to a third real world time. The system clock allows the network model to represent the real world system at any selected point in real world time. For example, the network model can be taken back in time by back dating the system clock. Likewise, the network model may be taken forward in time by forward dating the system clock. In this illustrative example, the system clock is set to a third real world time that is between the first and second real world times.

At block 154, the first object in the network model is selected. Because the system clock is set between the first and second real world times, the network model automatically displays the attribute values for the first object that are associated with the first real world time. If the system clock had been set to the second real world time or a time thereafter, the network model would have automatically displayed the attribute values associated with the second real world time. As such, in addition to tracking when objects are created and when they expire, the network model also tracks how the attribute values for objects evolve over time, and the attribute values displayed for a selected object are determined by the system clock.

As described above, the network model is capable of representing a number of different real world systems, such as telecommunication systems, water and sewer treatment systems, gas distribution systems, and the like. Accordingly, the design details of the network model, such as programming language, database selection, interface presentation, system hardware, etc, may vary to fit the particular application. Therefore, these types of details should be considered for the purpose of illustration and not limitation. In the illustrative embodiment described below, the network model is described with reference to an electric utility system.

Referring to FIG. 11, an illustrative network model 158 for an electric utility is shown. The network model 158 includes city blocks 162 displayed on a coordinate system 166. The network model 158 includes a command bar 170 with a plurality of icons 174 representing selectable functionality of the network model 158.

The network model 158 includes a geographically driven interface that is drillable allowing a user to select the desired level of detail displayed. In this view, the city blocks 162 are selectable objects that are graphically accessible using a conventional point-and-click interface. Although not shown, the network model 158 may be accessed using a web-enabled interface. That is, the network model 158 is accessible via the Internet using a web browser, such as Internet Explorer. Furthermore, any number of users may access and make changes to the network model 158 simultaneously.

Figure 12:
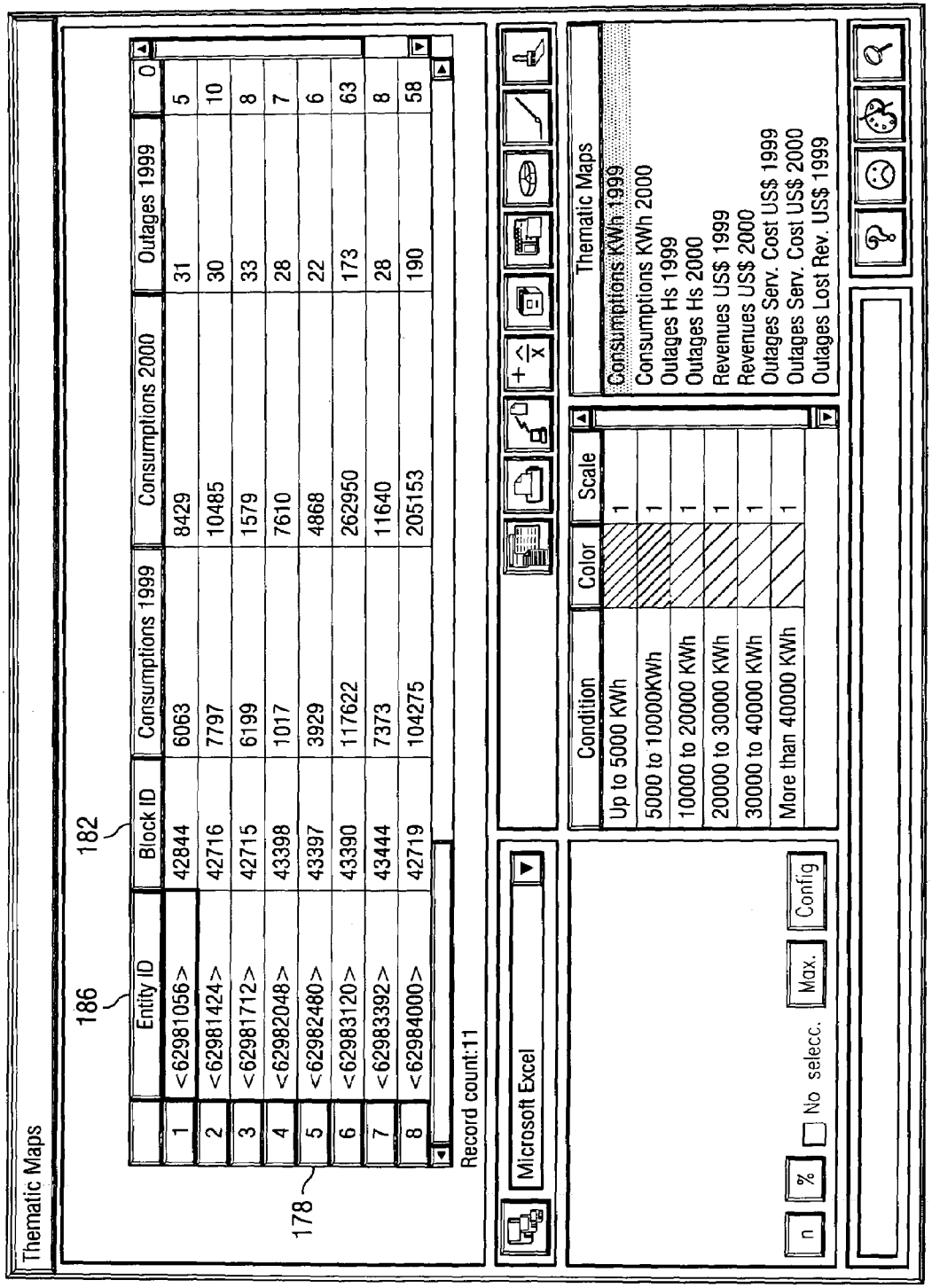
FIG. 12 is a table illustrating attribute data for objects in the network model shown in FIG. 11 at a selected real world time in accordance with one aspect of the present invention.

With the current level of detail shown, the city blocks 162 may be selected and their attribute data displayed. Referring to FIG. 12, a table 178 displays attribute data for the city blocks 162. The city blocks 162 are assigned a unique block identification number 182, along with a unique entity identification number 186. The table 178 may be customized to present the attribute data in a desired format. In this example, the columns of the table 178 include consumption 1999, consumption 2000, outages 1999, etc. If the table 178 is extended out, as illustrated in FIG. 13, additional columns, such as revenue 1999, revenue 2000, outage costs 2000, etc., are shown.

As described above, the attribute data for the city blocks 162 has been associated with real world times. In this example, the electric utility began operation in 1999. Therefore, the historical data for the network model 158 only dates back to 1999. The network model 158 has been configured in this particular example to display historical data, and the system clock (not shown) has been set to 2001. As such, data for years 1999 and 2000 is shown. In FIG. 12, for example, the electricity consumption for block '43398' in 1999 was 1017 KWh. In 2000, the electricity consumption for the same city block was 7610 KWh. It should be appreciated that depending upon the desired level of detail attribute data may be entered for particular months, weeks, days, hours, etc.

Figure 14:
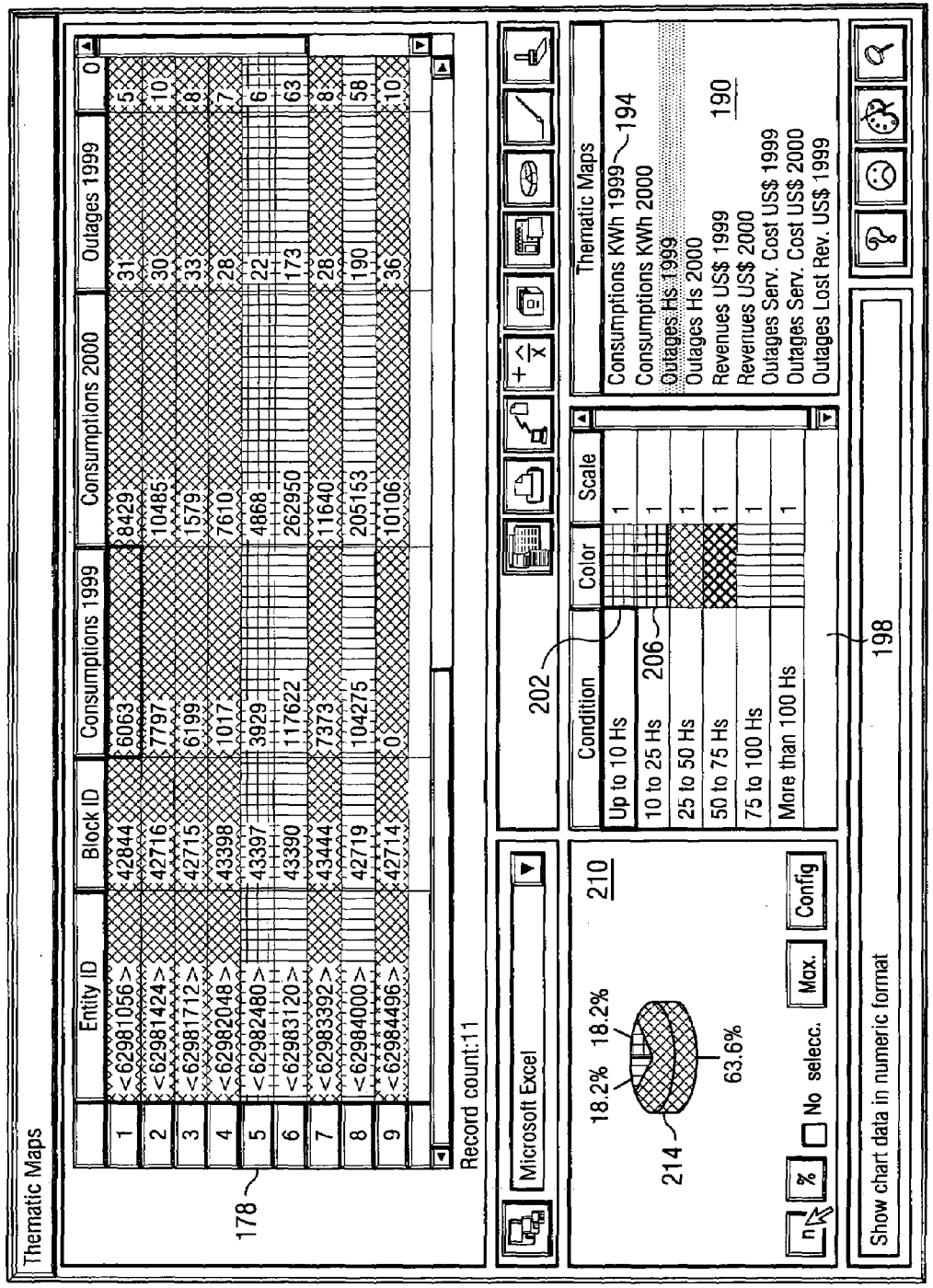
FIG. 14 is a table illustrating attribute data for objects in the network model shown in FIG. 11 at a selected real world time in accordance with one aspect of the present invention.

Referring to FIG. 14, a thematic maps box 190 having a number of selectors 194 is shown. The thematic maps box 190 may be used to code data displayed in the table 178 for easier readability. A Legend box 198 displays the coding scheme.

In this example, selector "Outages Hs 1999" (i.e., outage hours in 1999) has been selected. The rows of the table 178 have been coded according to the coding scheme shown in the Legend box 198. Any number of codes may be used to distinguish the data, such as hatching, shading, etc. In this example, the Legend box 198 uses color codes to differentiate different ranges of outage hours. For example, outage hours 0–10 are represented by a first color 202, outage hours 10–25 are represented by a second color 206, and so on. The rows of the table 178 have been coded according to the chosen selector 194, and the coding scheme shown in the Legend box 198. For example, block number '43397' has been coded with the second color 206 because the outage hours are between 10 and 25 hours.

A graph box 210 displays a graphical representation of the data. In this example, for the selector 'Outages Hs 1999', a circle graph 214 displays the 1999 outage data for the city blocks 162 shown in the network model 158. In 1999, 63.6% of the city blocks 162 experienced outages totaling 25–50 hours, while 18.2% of the city blocks 162 experienced outages totaling more than 100 hours.

Figure 15:
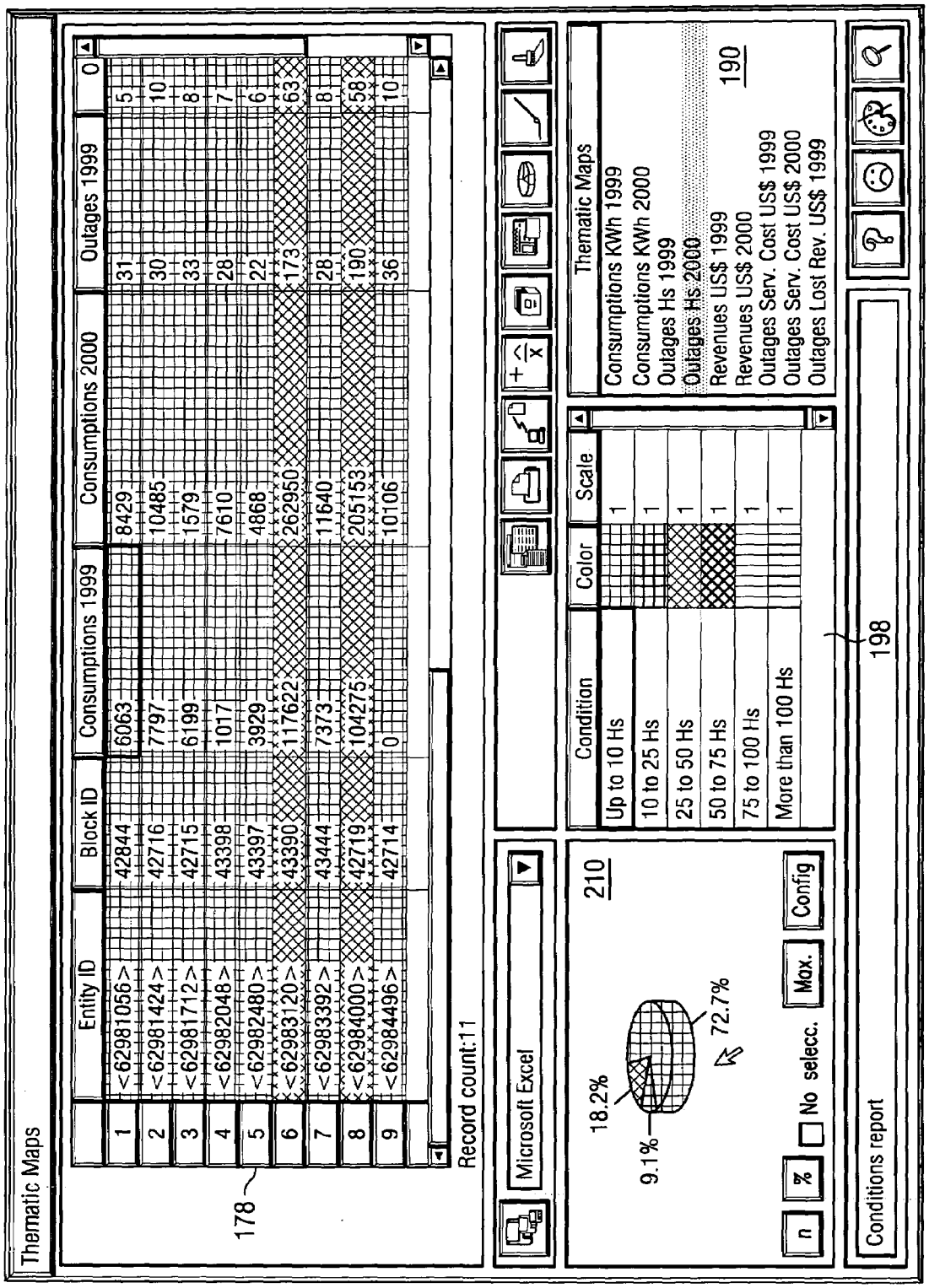
FIG. 15 is a table illustrating attribute data for objects in the network model shown in FIG. 11 at a selected real world time in accordance with one aspect of the present invention.

In FIG. 15, the selector 'Outages Hs 2000' (i.e., outage hours in 2000) has been selected. The table 178 has been coded according to the Legend box 198, which again uses a color-coding scheme. The graph box 210 indicates that 72.7% of the city blocks 162 in 2000 experienced outages between 0 and 10 hours. Because the attribute 'outage hours' has been associated with real world times, the attribute may be historically traced for years, 1999 and 2000. In this example, the outage hours for the city blocks 162 was significantly reduced between 1999 and 2000, the cause of this reduction may be determined using the time centric feature of the network model 158, further described below.

Figure 16:
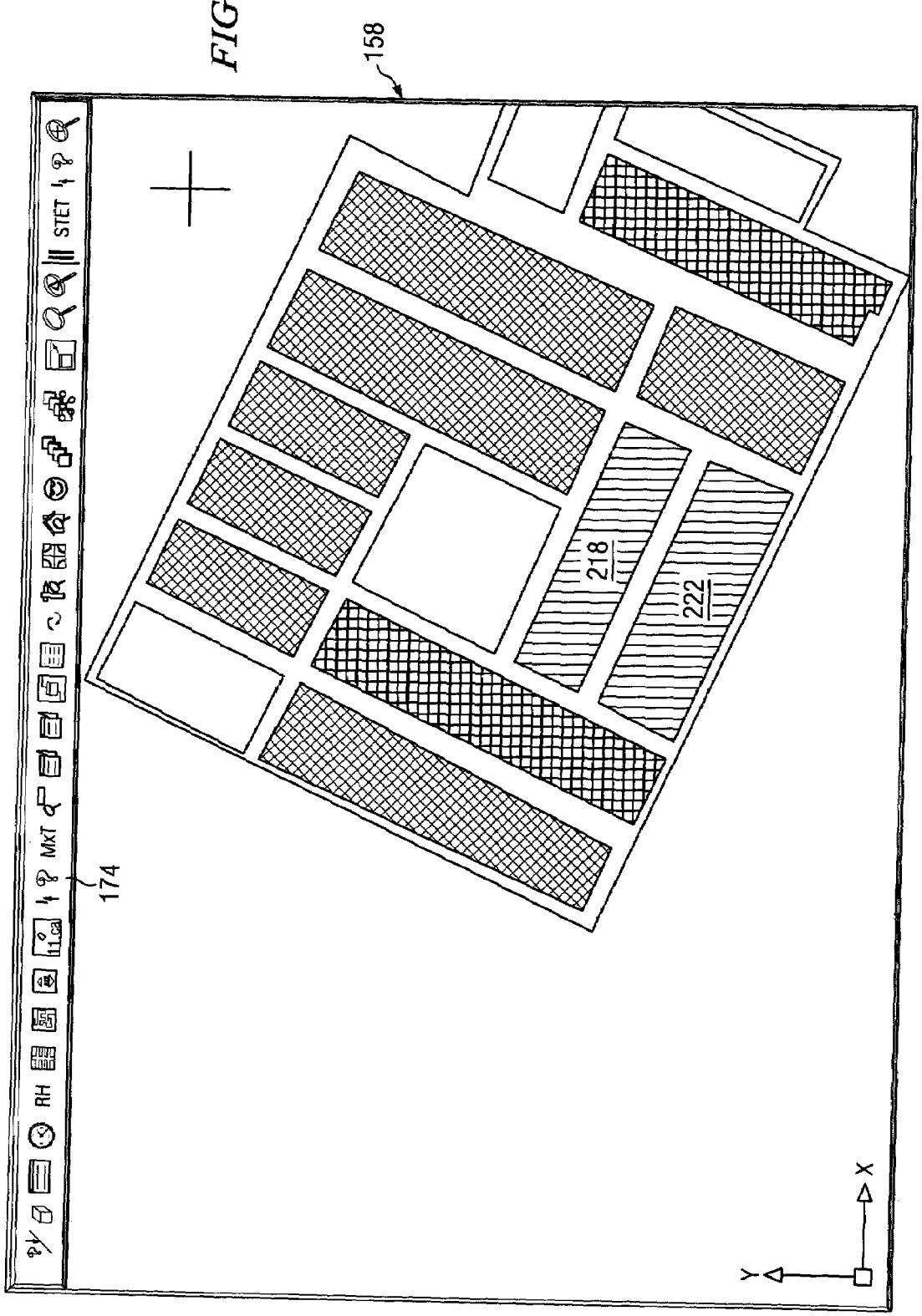
FIG. 16 is a second view of the network model shown in FIG. 11 in accordance with one aspect of the present invention.

Referring to FIG. 16, the network model 158 is shown using the coding scheme of the Legend box 198 in FIG. 14 (i.e., the network model 158 is color-coded to represent outages in 1999). In this view, a first city block 218 and a second city block 222 are shown having outages of more than 100 hours. In FIG. 14, the block identification numbers are shown to be '43390' and '42719'.

Figure 17:
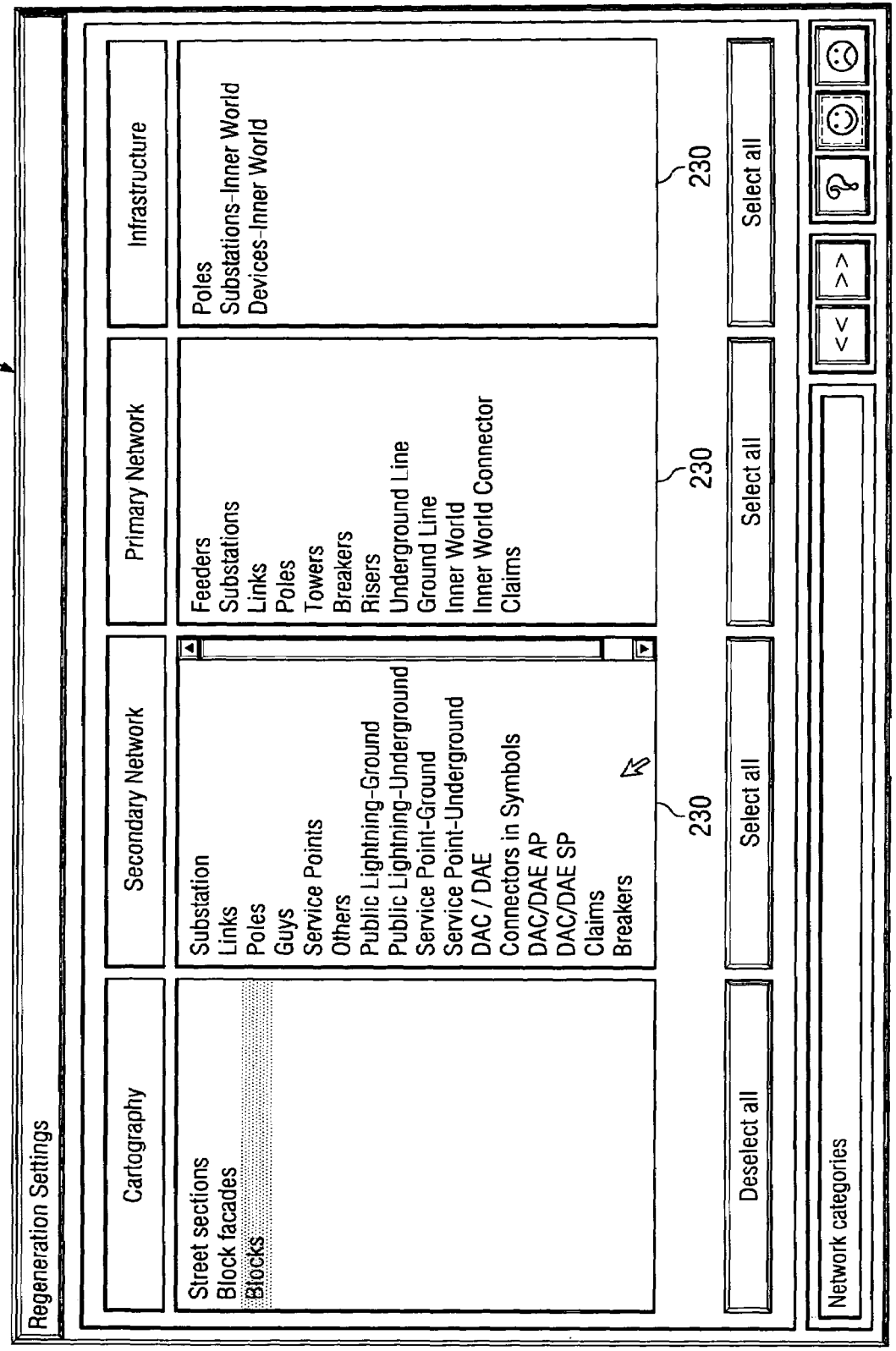
FIG. 17 is a table illustrating objects that are capable of being displayed by the network model shown in FIGS. 11 and 16.

In FIG. 17, after selecting the appropriate icon 174, the network model 158 displays a regeneration box 226. The regeneration box 226 lists objects 230 that are selectable for display by the network model 158. In this view, 'Blocks' is selected in the 'Cartography' column, and the displayable objects 230 are shown in the remaining columns. For example, in the 'Primary Network' column the user may select to display substations, feeders, breakers, etc.

Figure 18:
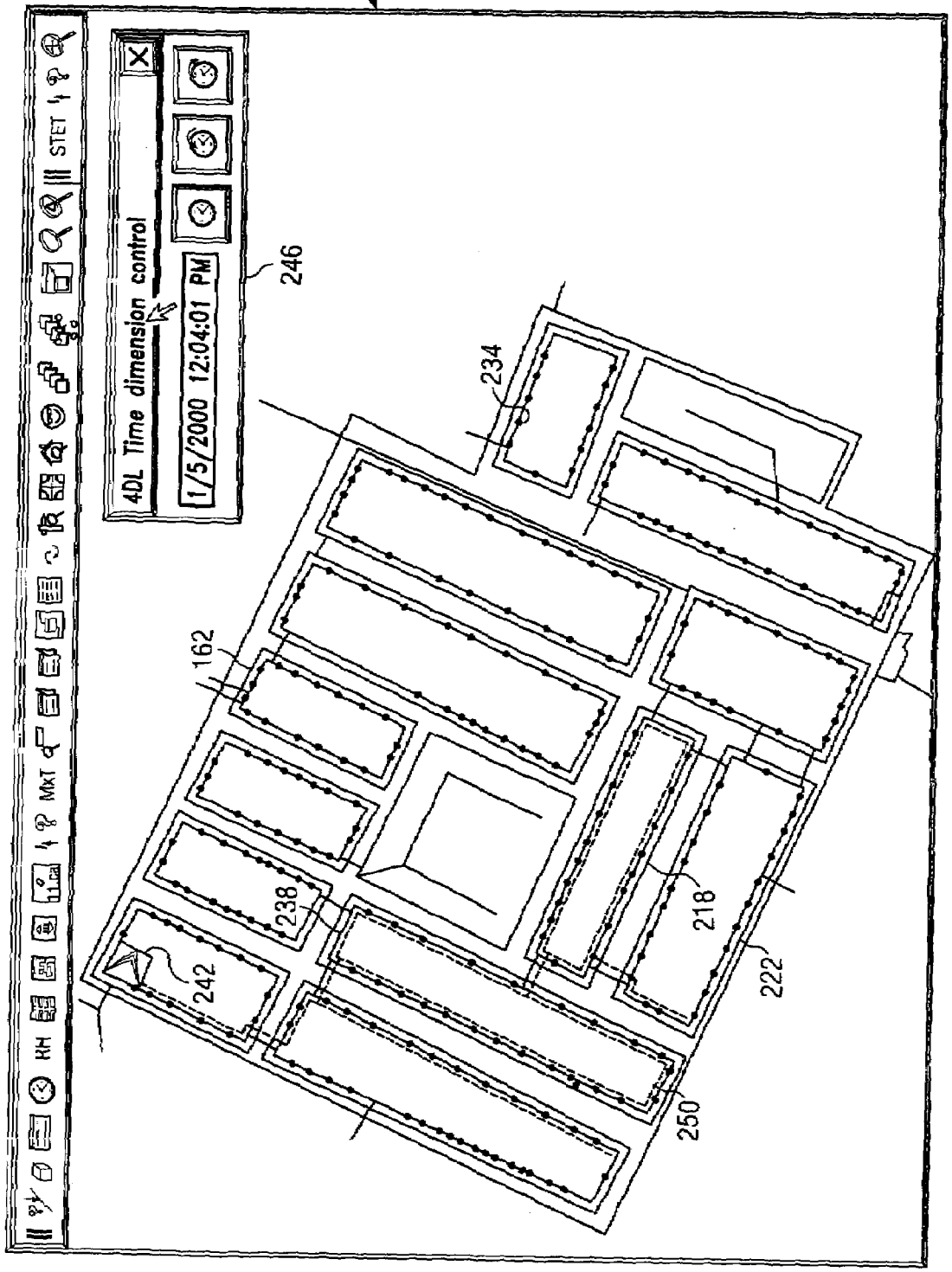
FIG. 18 is a third view of the network model shown in FIG. 11 in accordance with one aspect of the present invention.

In FIG. 18, after making the appropriate selections in the regeneration box 226, the network model 158 is regenerated showing a number of service points 234, feeders 238, and a first substation 242. In this view, the network model 158 illustrates the topology of the real world system at the selected real world time (e.g., Jan. 5, 2000, 12:04:01 PM) shown by system clock 246.

If the first city block 218 is selected, the network model 158 is able to trace the power source for the first city block 218 back to the first substation 242 illustrated by a power source trace 250. This is because the logical relationships between objects in the network model 158 are associated with real world times. When objects are posted to the network model 158 their relationship attributes are associated with real world times. Simplistically stated, a service point 234, for example, when posted to the network model 158 may be associated with a feeder 238, which may be associated to additional feeders 238 that eventually terminate at the first substation. This permits the topology of the network model 158 to be drawn at any selected point in time. In this example, at the selected point in time, the first substation 242 is shown to be the only source of power for the city blocks 162, which may have contributed to the excessive outage hours in 1999.

Figure 19:
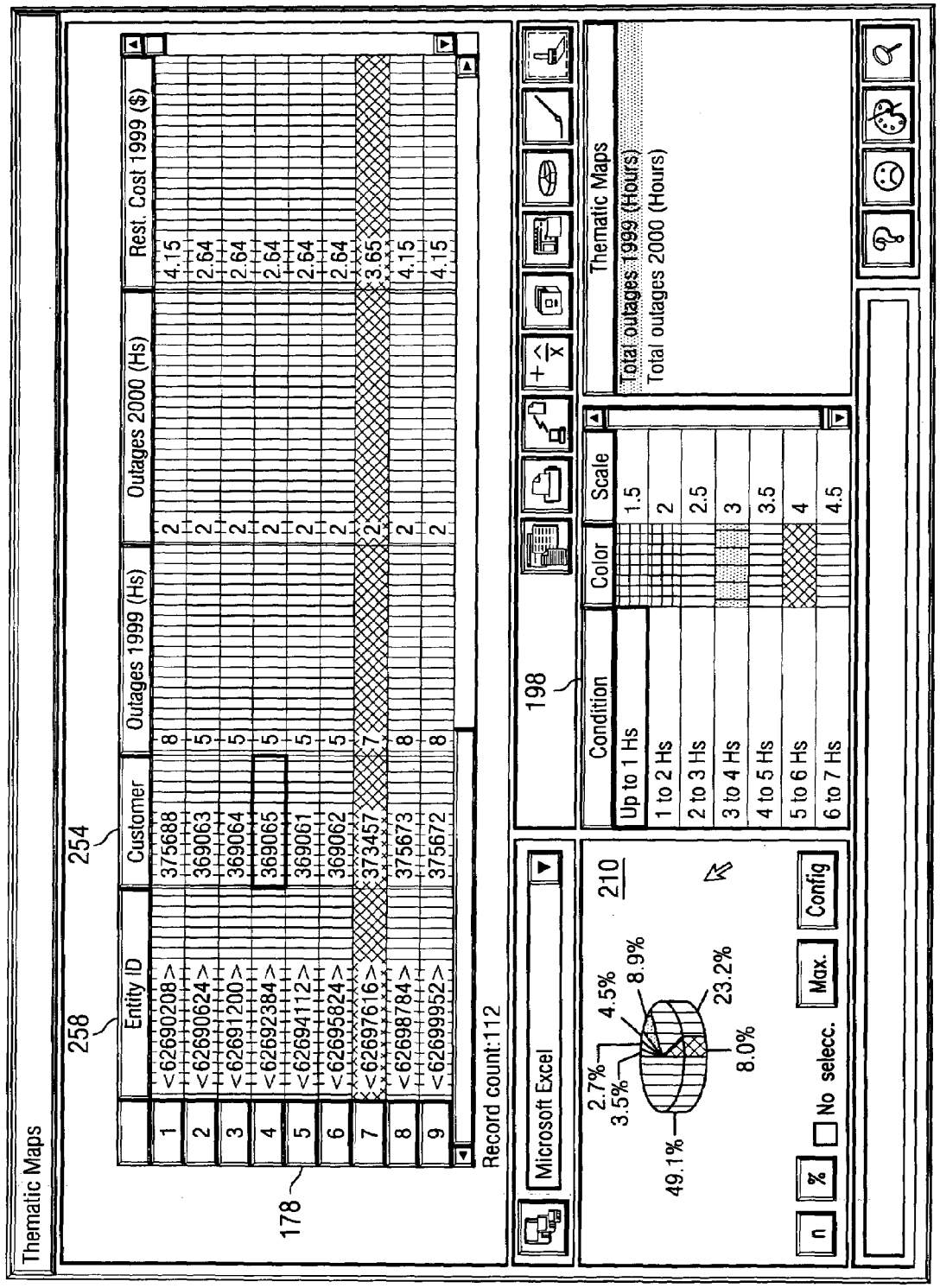
FIG. 19 is a table illustrating attribute data for objects in the network model shown in FIG. 18 at a selected real world time in accordance with one aspect of the present invention.

In FIG. 19, attribute data is shown for the service points 234 displayed in the network model 158. The service points 234 are associated with a customer number 254 and entity identification number. Similar to the city blocks 162, attribute data for the service points 234 is associated with real world time. In this example, outage data for 1999 and 2000 is shown. The selector 'Total outages 1999 (Hours)' has been selected, and the rows in the table 178 have been coded according to the attribute values for outage hours in 1999 and the coding scheme in the Legend box 198. The graph box 210 illustrates that 49.1% of the service points 234 were without power for more than 7 total hours in 1999, a majority of which are known to be in the first and second city blocks 218, 222 shown in FIG. 18.

Figure 20:
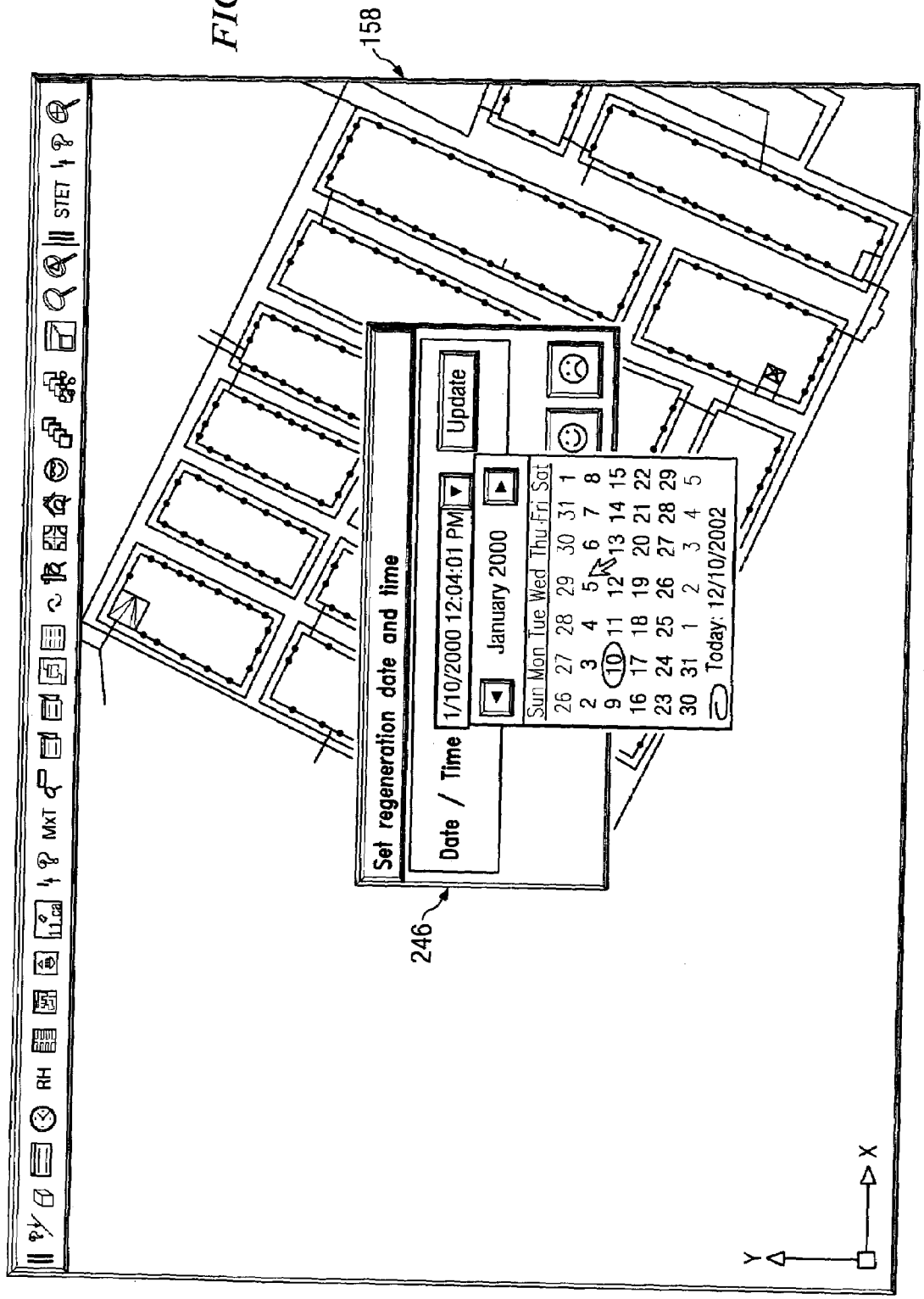
FIG. 20 is an illustrative embodiment of a system clock in accordance with one aspect of the present invention.
Figure 21:
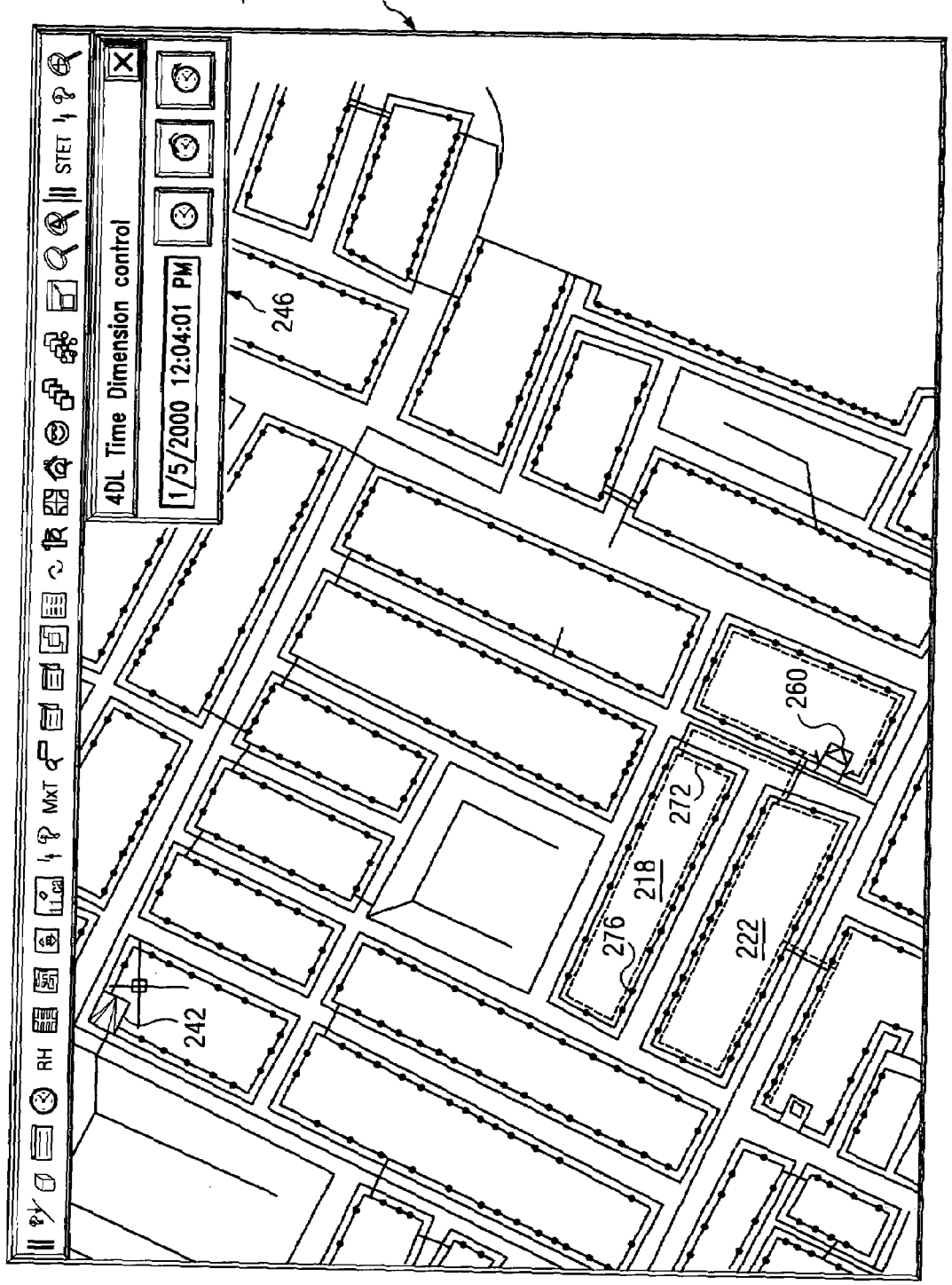
FIG. 21 is an illustrative embodiment of a system clock and a fourth view of the network model shown in FIG. 11 in accordance with one aspect of the present invention.

Referring to FIGS. 20 and 21, the system clock 246 in the network model 158 is shown being changed from Jan. 5, 2000, 12:04:01 PM (i.e., first real world time) to Jan. 5, 2001 12:04:01 PM (i.e., second real world time). Once changed, the network model 158 is displayed at the selected real world time.

In FIG. 21, the network model 158 is shown with the same level of detail depicted in FIG. 18, but the logical and physical views are determined at the second real world time. At the second real world time, a second substation 260 is shown in the network model 158. The second substation 260 is shown because its creation date precedes the second real world time, and its expiration date follows the second real world time. Similarly, the second substation is not shown in FIG. 18 because its creation date follows the first real world time.

Referring to FIG. 22, if the second substation 260 is selected, a creation date 264 and an expiration date 268 is shown. In this example, the creation date 264 for the second substation 260 is Apr. 20, 2000, and its expiration date 268 is Dec. 31, 2021. Given the expiration date 268, if the system clock 246 had been set to Jan. 1, 2022, the second substation 260 would not be shown in the network model 158. In addition, to the creation date 264 and the expiration date 268, the network model 158 may be customized to include and display any useful attribute of the second substation 260.

Referring back to FIG. 21, if traced at the second real world time, the second substation 260 is shown feeding power to the first and second city blocks 218, 222 illustrated by a second power source trace 272. Before the second substation 260 was added to the real world system, the first substation 242 was shown to be servicing the additional load of the first and second city blocks 218, 222. This extra load likely contributed to the excessive outage hours shown in FIGS. 14, 16, and 19. As shown in FIG. 15, once the second substation 260 was added on Apr. 20, 2000 (see FIG. 19), the performance of the utility system improved.

The positive effect of adding the second substation 260 to the utility system may be quantified when viewed from the vantage of an individual service point 276 in the first city block 218. In FIG. 23, the service point 276 is selected and has an identification number '381752.' The system clock is set to Jan. 5, 2000 to display the historical consumption data for the service point 276 between Jan. 12, 1999 and Dec. 12, 1999. In 1999, the second substation 260 had not yet been added to the electric utility system, which is illustrated by FIG. 18.

Referring to FIG. 24, if the system clock 246 is set to Jan. 5, 2001 historical consumption data is displayed for the same service point 276 between the dates Jan. 12, 2000 and Dec. 12, 2000. When compared with FIG. 23, the consumption data for the service point 276 is much higher in 2000 than it was in 1999. This is attributable to the reduced outage hours for the overall utility system caused by the addition of the second substation 260. By toggling the system clock 246 between Jan. 5, 2000 and Jan. 5, 2001, the historical attribute data for the service point 276 is easily compared.

Referring to FIG. 25, attribute data for multiple service points 234 is displayed in a table 280. In FIG. 25, the system clock 246 is set to Jan. 5, 2001, and the historical consumption data for the service points 234 is displayed for 1999 and 2000. In general, the consumption and revenue data is much higher in 2000, after the second substation 260 was added to the utility system. Depending on the column selected, a sum 284 and an average 288 is displayed, which provides a quick summary of the attribute data.

The above analysis is made possible because objects in the network model 158 are assigned real world creation and expiration dates and because object attribute data is associated with real world times. By adjusting the system clock 246, the network model 158 may be taken backwards and forwards in time allowing the real world system to be modeled from a number of different perspectives.

As indicated above, aspects of this invention pertain to specific "method functions" implementable through various computer systems. In an alternate embodiment, the invention may be implemented as a computer program product for use with a computer system. Those skilled in the art should readily appreciate that programs defining the functions of the present invention can be delivered to a computer in many forms, which include, but are not limited to: (a) information permanently stored on non-writeable storage media (e.g., read only memory devices within a computer such as ROMs or CD-ROM disks readable only by a computer I/O attachment); (b) information alterably stored on writeable storage media (e.g., floppy disks and hard drives); or (c) information conveyed to a computer through communication media, such as a local area network, a telephone network, or a public network like the Internet. It should be understood, therefore, that such media, when carrying computer readable instructions that direct the method functions of the present invention, represent alternate embodiments of the present invention.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for modeling a real world system, comprising:

creating a network model that includes a plurality of objects that represent assets in the real world system at real world times, the network model being displayable by a geographic information system;

entering a first object in the network model, wherein the first object is associated with a first creation date and a first expiration date at first and second real world times, respectively;

entering a second object in the network model, wherein the second object is associated with a second creation date and a second expiration date at third and fourth real world times, respectively; and in response to setting a system clock in the network model to a fifth real world time that is between the first and third real world times, and before the second real world time, displaying the first object and any additional objects in the network model that represent assets present in the real world system and the fifth real world time.

2. A method for modeling a real world system, comprising:

creating a network model that includes a plurality of objects that represent assets in the real world system at real world times, the network model being displayable by a geographic information system;

entering attribute data at a first transaction time for a first object in the network model, wherein the attribute data is associated with a first real world time;

entering attribute data at a second transaction time for the first object in the network model, wherein the attribute data is associated with a second real world time which is later than the first real world time;

in response setting a system clock in the network model to a third real world time that is between the first and second real world times, selecting the first object in the network model, not displaying attribute data for the first object that is associated with the second real world time, and automatically displaying attribute data for the first object that is associated with the first real world time.

* * * * *